(12) United States Patent
Lim et al.

(10) Patent No.: US 11,322,667 B2
(45) Date of Patent: May 3, 2022

(54) LIGHT-EMITTING DEVICE PACKAGE

(71) Applicant: SUZHOU LEKIN SEMICONDUCTOR CO., LTD., Taicang (CN)

(72) Inventors: Chang Man Lim, Seoul (KR); June O Song, Seoul (KR); Won Jung Kim, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 0 days.

(21) Appl. No.: 16/649,553

(22) PCT Filed: Sep. 20, 2018

(86) PCT No.: PCT/KR2018/011185
§ 371 (c)(1),
(2) Date: Mar. 20, 2020

(87) PCT Pub. No.: WO2019/059690
PCT Pub. Date: Mar. 28, 2019

(65) Prior Publication Data
US 2020/0287107 A1 Sep. 10, 2020

(30) Foreign Application Priority Data

Sep. 22, 2017 (KR) .......................... 10-2017-0122901
Nov. 7, 2017 (KR) .......................... 10-2017-0147410

(51) Int. Cl.
*H01L 33/56* (2010.01)
*H01L 33/38* (2010.01)
(Continued)

(52) U.S. Cl.
CPC ............ *H01L 33/56* (2013.01); *H01L 33/382* (2013.01); *H01L 33/486* (2013.01);
(Continued)

(58) Field of Classification Search
CPC ..... H01L 33/502; H01L 33/504; H01L 33/50; H01L 33/501; H01L 33/54; H01L 33/62;
(Continued)

(56) References Cited

U.S. PATENT DOCUMENTS 6,531,328 B1 3/2003 Chen
2006/0147746 A1 7/2006 Wakako et al.
(Continued)

FOREIGN PATENT DOCUMENTS

JP 2006-228856 A 8/2006
KR 10-0610650 B1 8/2006
(Continued)

OTHER PUBLICATIONS

International Search Report (PCT/ISA/210) issued in PCT/KR2018/11185, dated Mar. 29, 2019.

*Primary Examiner* — Marcos D. Pizarro
*Assistant Examiner* — Antonio B Crite
(74) *Attorney, Agent, or Firm* — Birch, Stewart, Kolasch & Birch, LLP

(57) ABSTRACT

A semiconductor device package includes a light emitting device disposed on a body, and at least one resin disposed between the body and the light emitting device. The body may include first and second opening parts passing through the body from the upper surface of the body, and at least one recess concavely provided from the upper surface of the body towards the lower surface of the body. The light emitting device may include a first bonding part disposed on the first opening part, and a second bonding part disposed on the second opening part. The at least one recess may be disposed between the first and second opening parts, and along the circumferences of the first and second opening (Continued)

parts. The at least one resin may be provided to the at least one recess. The at least one resin may include a reflective material.

19 Claims, 21 Drawing Sheets

(51) Int. Cl.
| | |
|---|---|
| *H01L 33/48* | (2010.01) |
| *H01L 33/50* | (2010.01) |
| *H01L 33/54* | (2010.01) |
| *H01L 33/60* | (2010.01) |
| *H01L 33/62* | (2010.01) |
| *H01L 33/46* | (2010.01) |
| *H01L 33/20* | (2010.01) |

(52) U.S. Cl.
CPC ............ *H01L 33/502* (2013.01); *H01L 33/54* (2013.01); *H01L 33/60* (2013.01); *H01L 33/62* (2013.01); *H01L 2933/005* (2013.01); *H01L 2933/0066* (2013.01); *H01L 2933/0091* (2013.01)

(58) Field of Classification Search
CPC ..... H01L 33/486; H01L 33/60; H01L 33/382; H01L 33/48; H01L 33/483; H01L 33/387; H01L 24/08; H01L 24/32
See application file for complete search history.

(56) References Cited

U.S. PATENT DOCUMENTS

| | | | |
|---|---|---|---|
| 2011/0291143 A1 | 12/2011 | Kim et al. | |
| 2014/0332839 A1* | 11/2014 | Choi | ............... H01L 33/62 257/99 |
| 2016/0111591 A1* | 4/2016 | Choi | ............... H05B 33/12 438/7 |
| 2019/0088832 A1* | 3/2019 | Onuma | ............. H01L 33/504 |

FOREIGN PATENT DOCUMENTS

| | | |
|---|---|---|
| KR | 10-2010-0080423 A | 7/2010 |
| KR | 10-2014-0132068 A | 11/2014 |
| KR | 10-1778141 B1 | 9/2017 |

* cited by examiner

[FIG. 1]
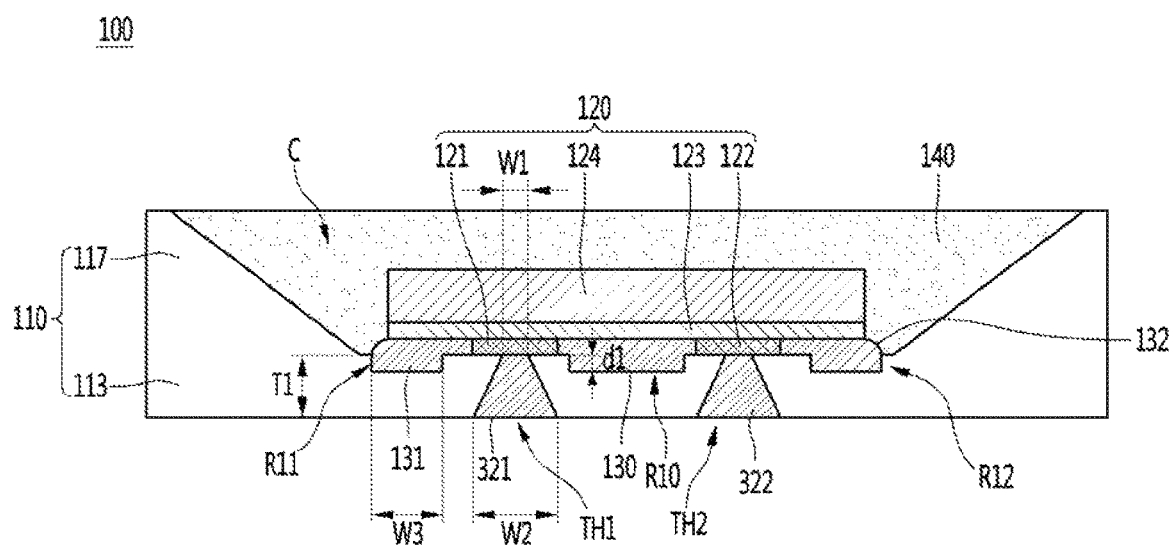

[FIG. 2]
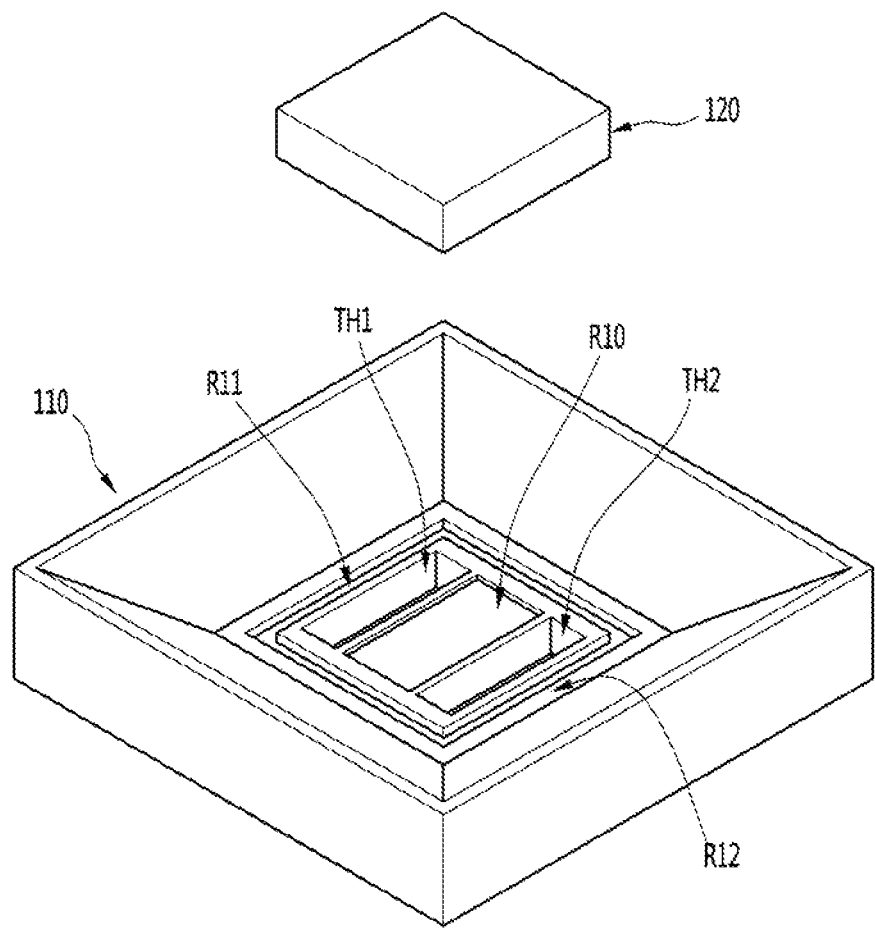

[FIG. 3]
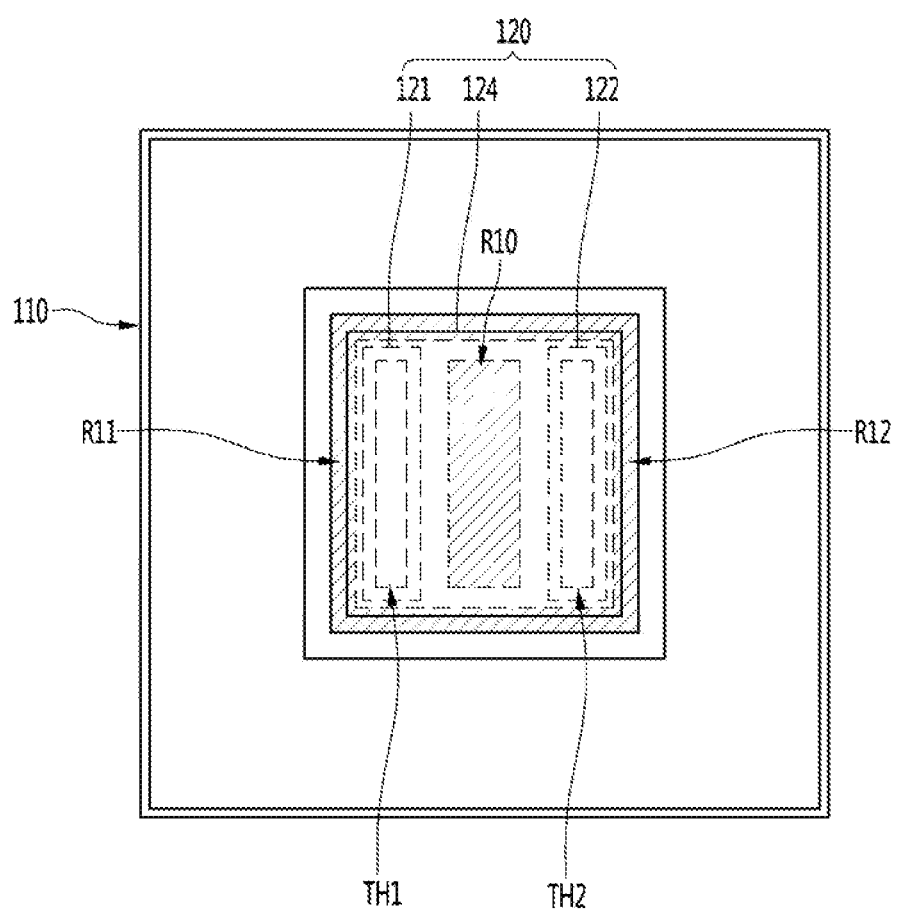

【FIG. 4】
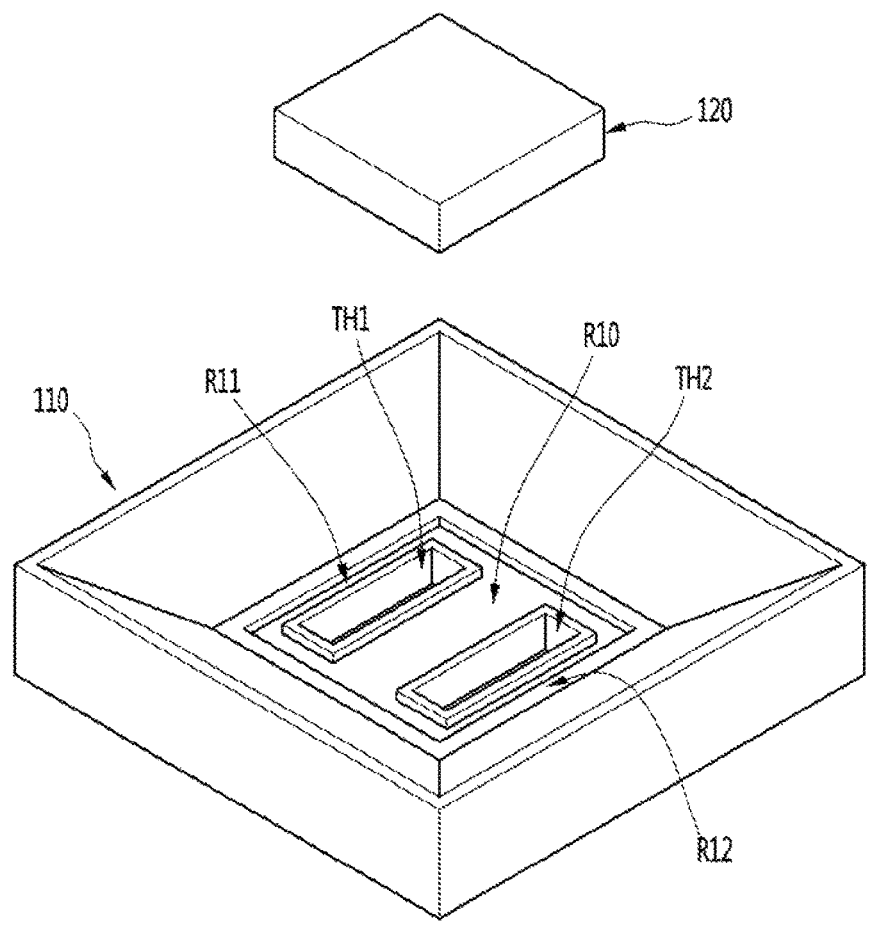
【FIG. 5】
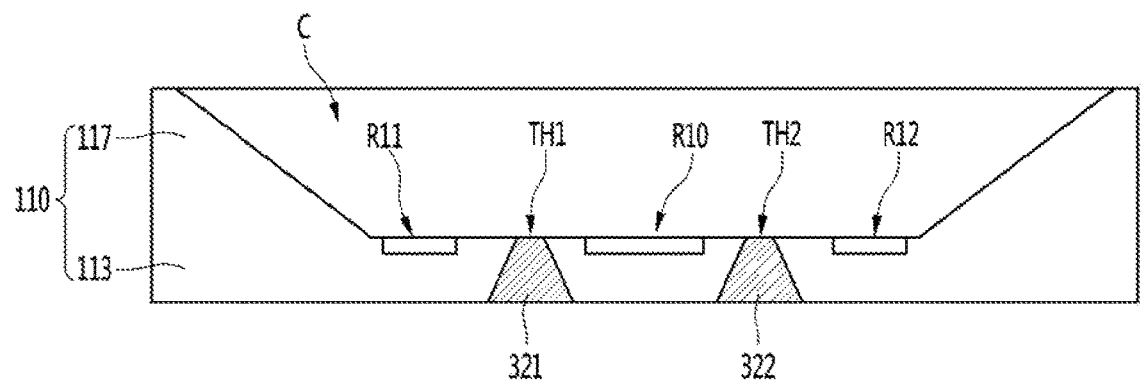

[FIG. 6]
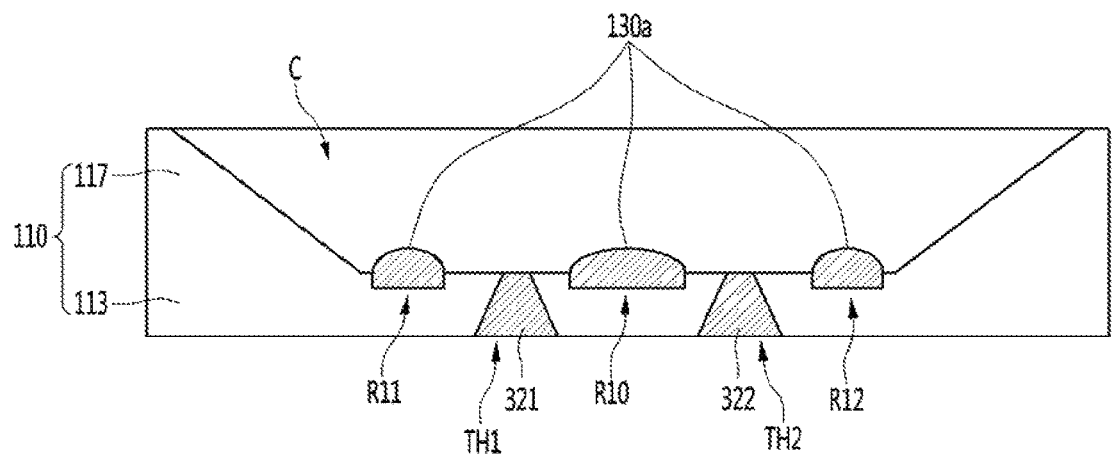
[FIG. 7]
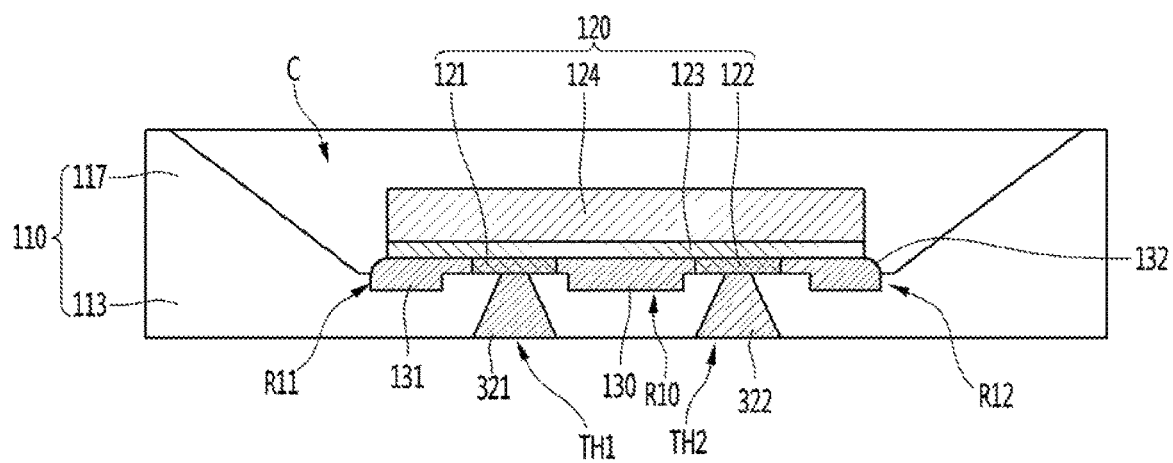

[FIG. 8]
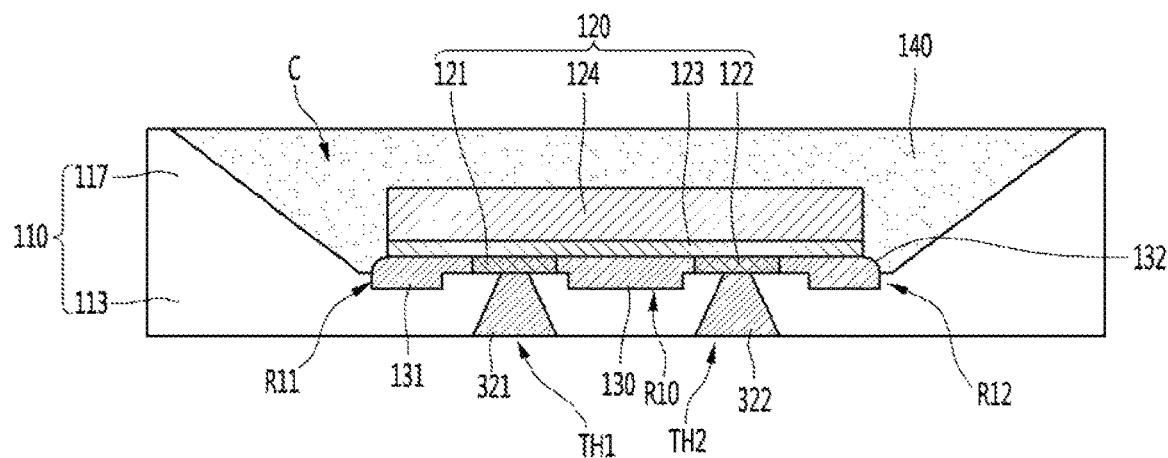
[FIG. 9]
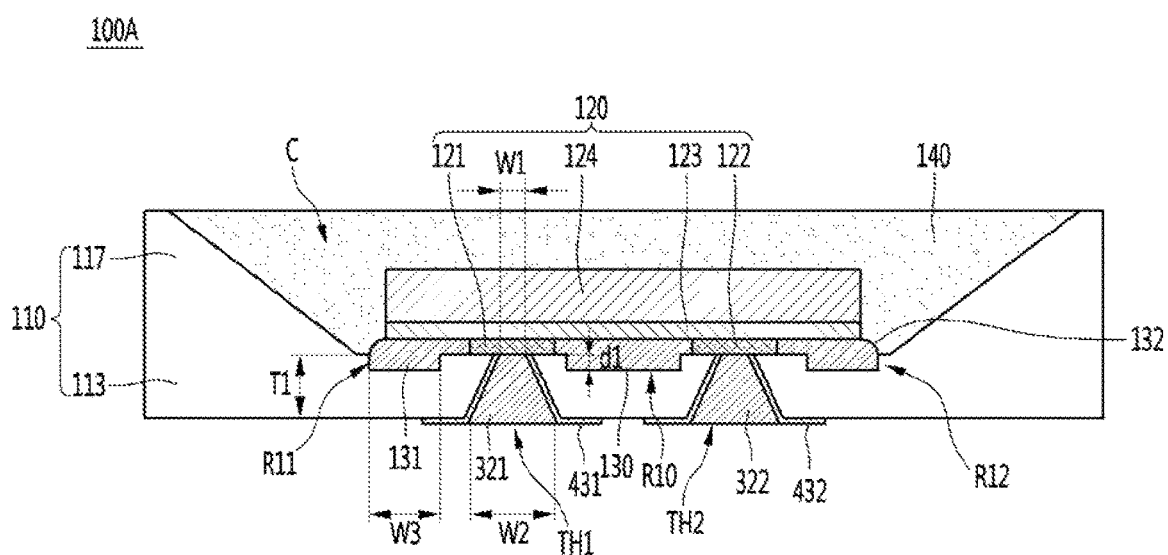

[FIG. 10]
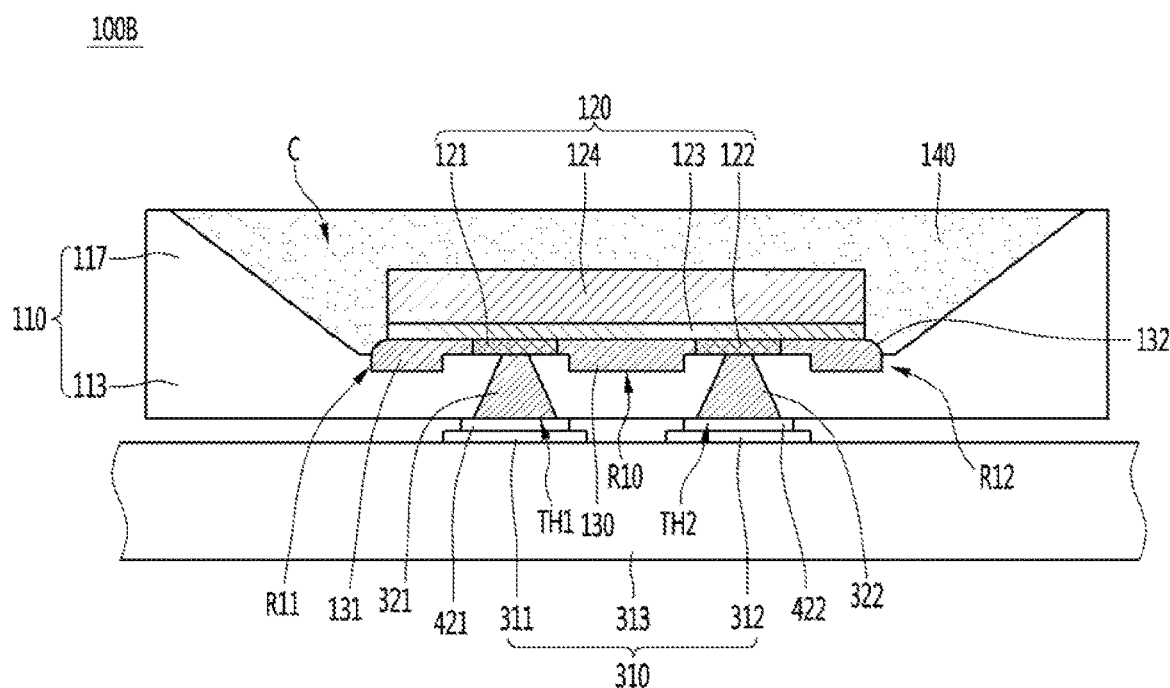
[FIG. 11]
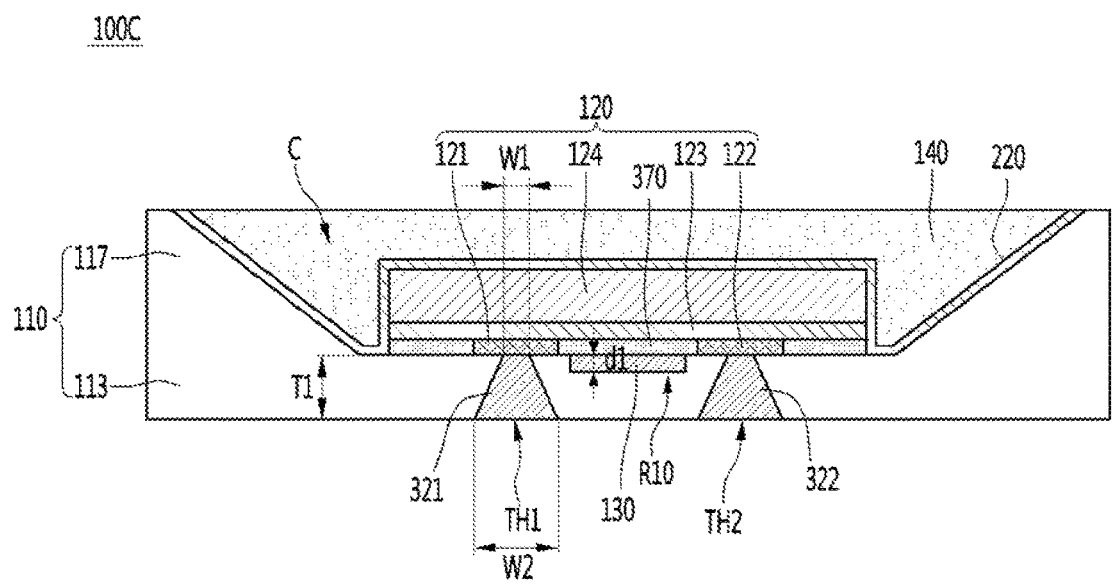

【FIG. 12】
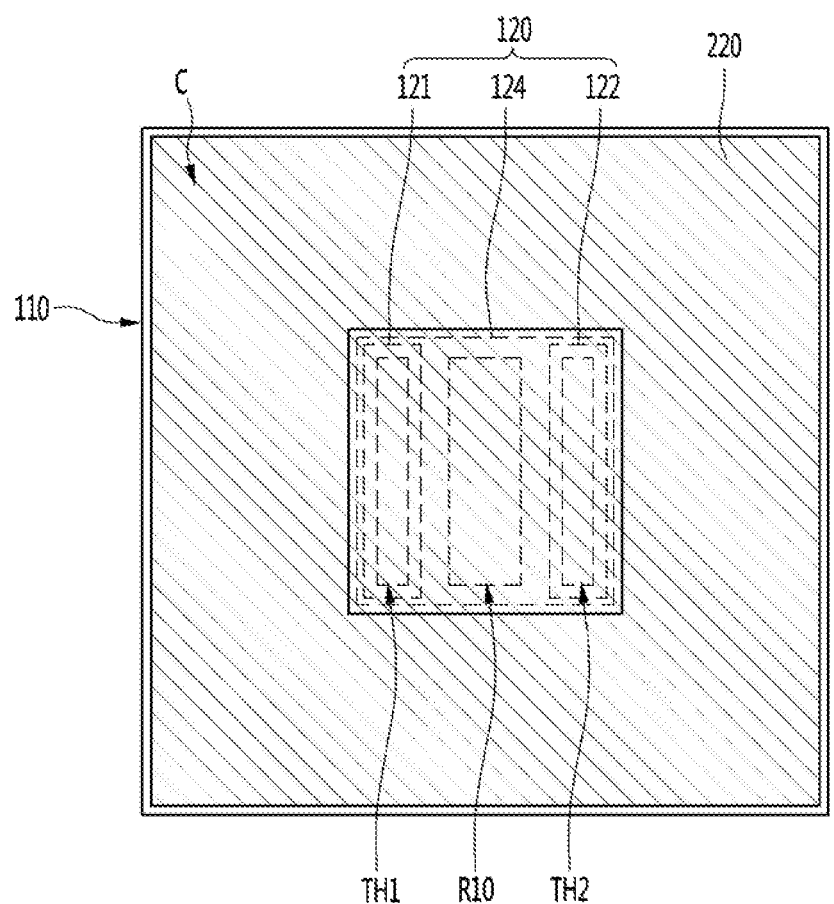

[FIG. 13]
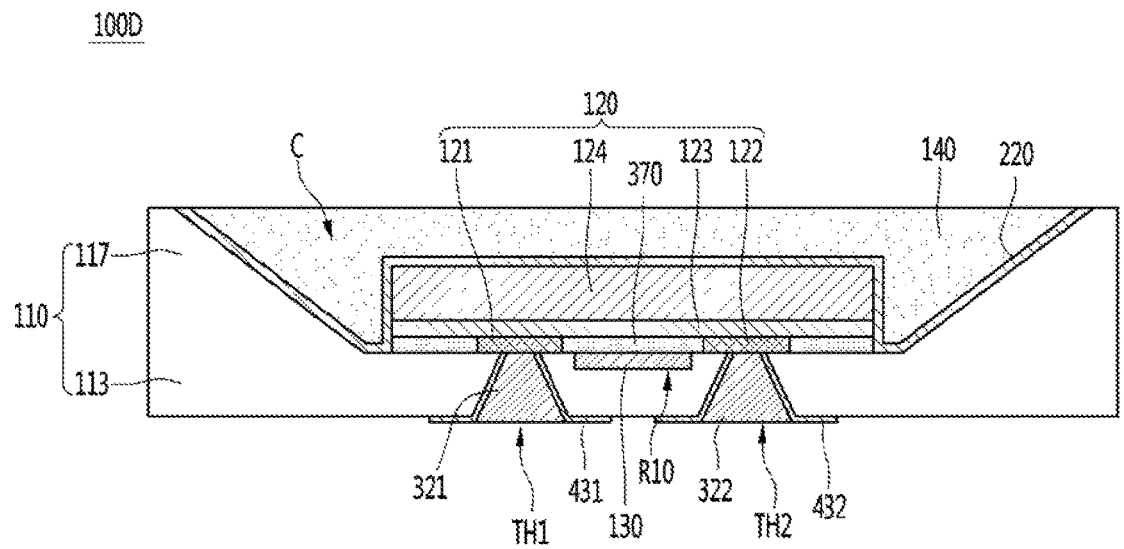
[FIG. 14]
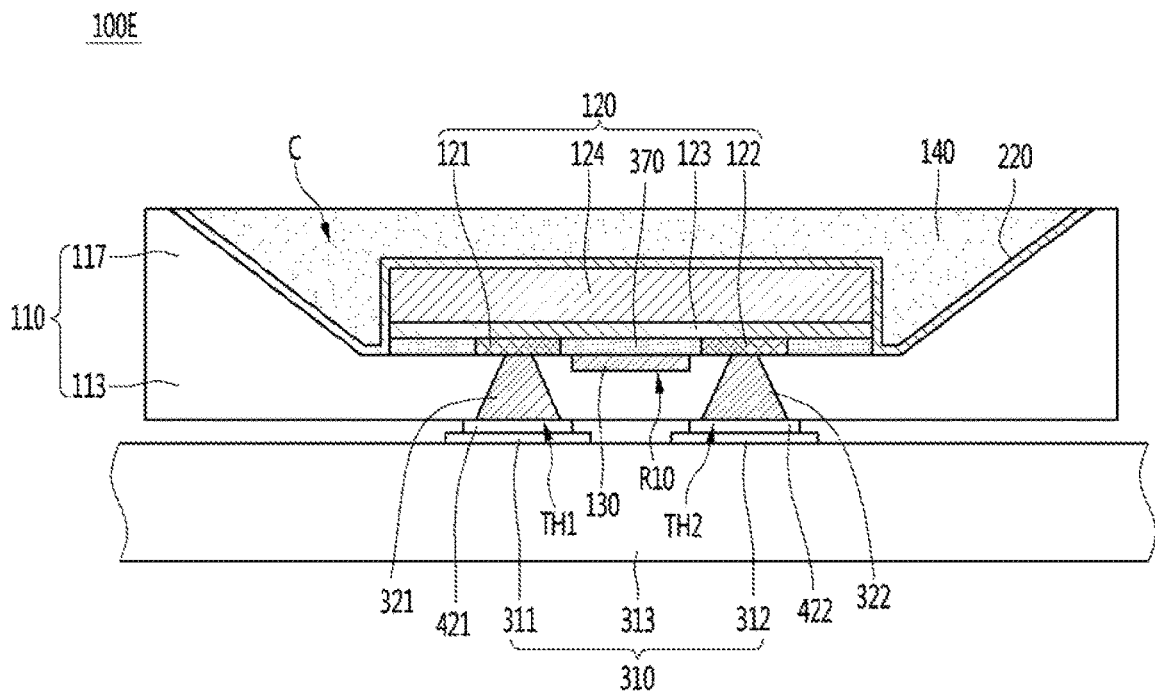

[FIG. 15]
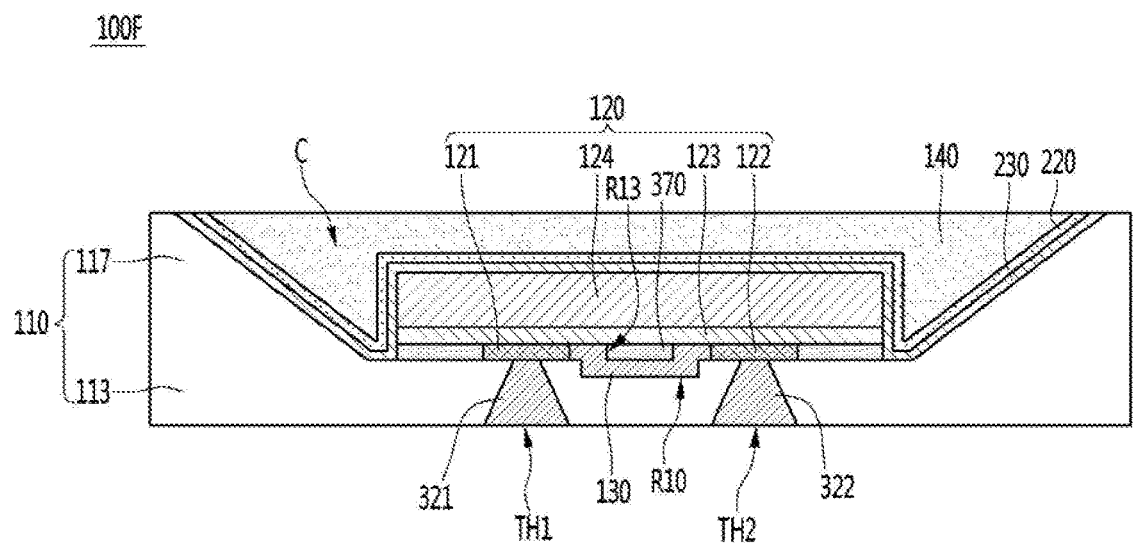
[FIG. 16]
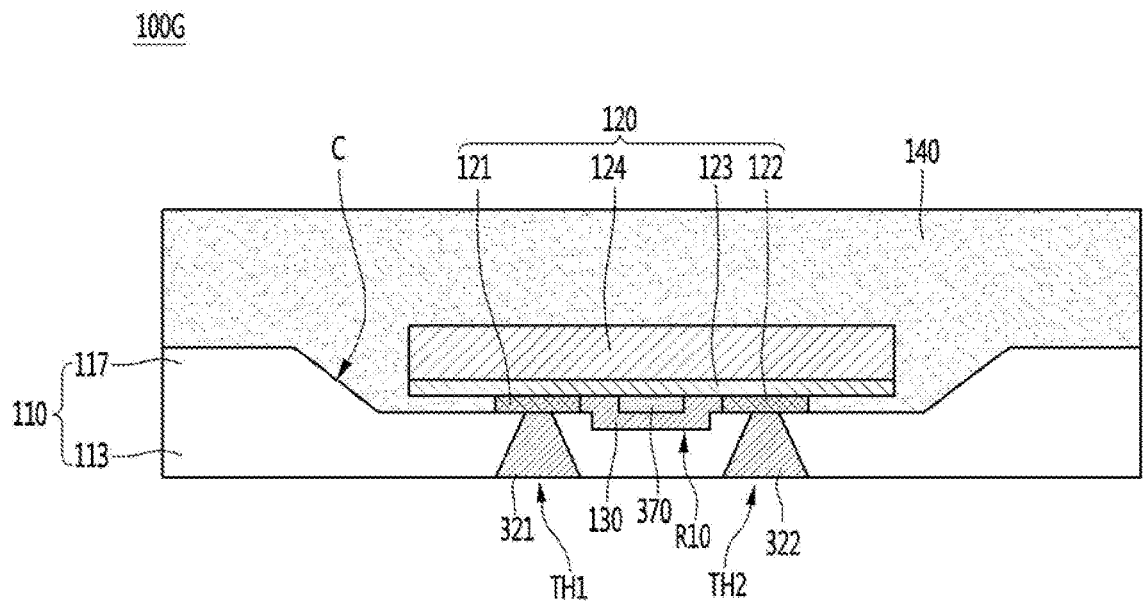

[FIG. 17]
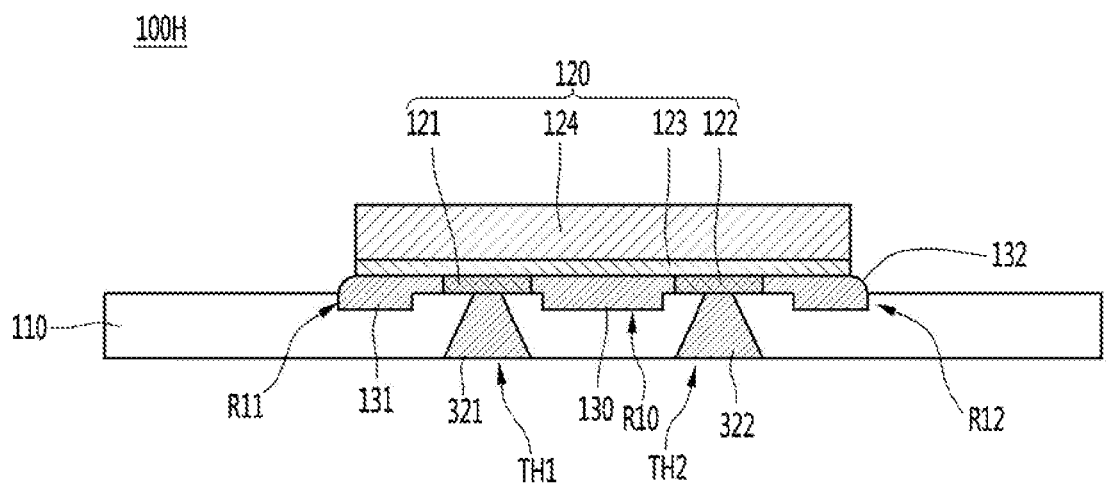
[FIG. 18]
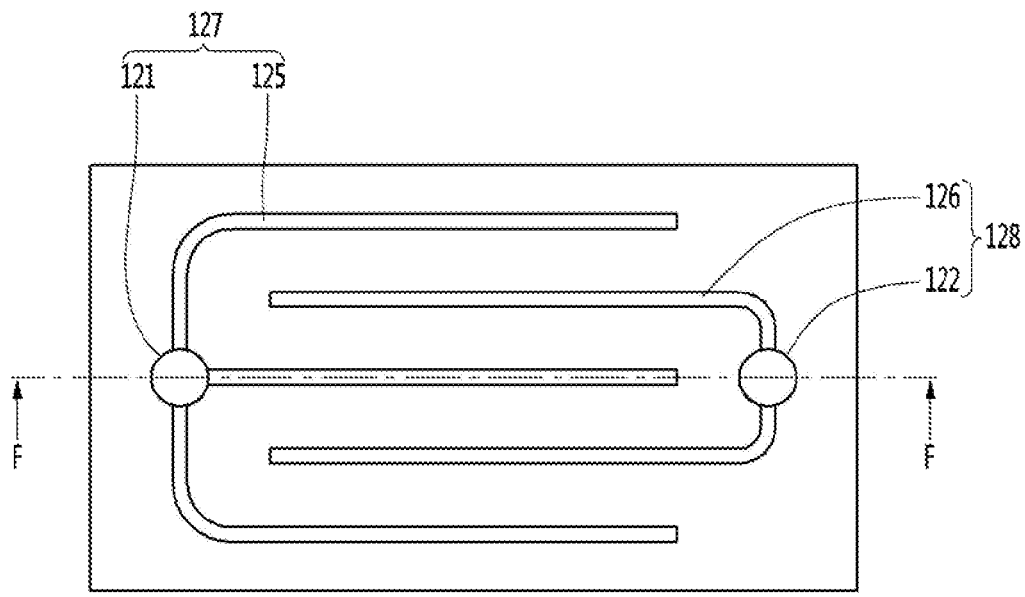

[FIG. 19]
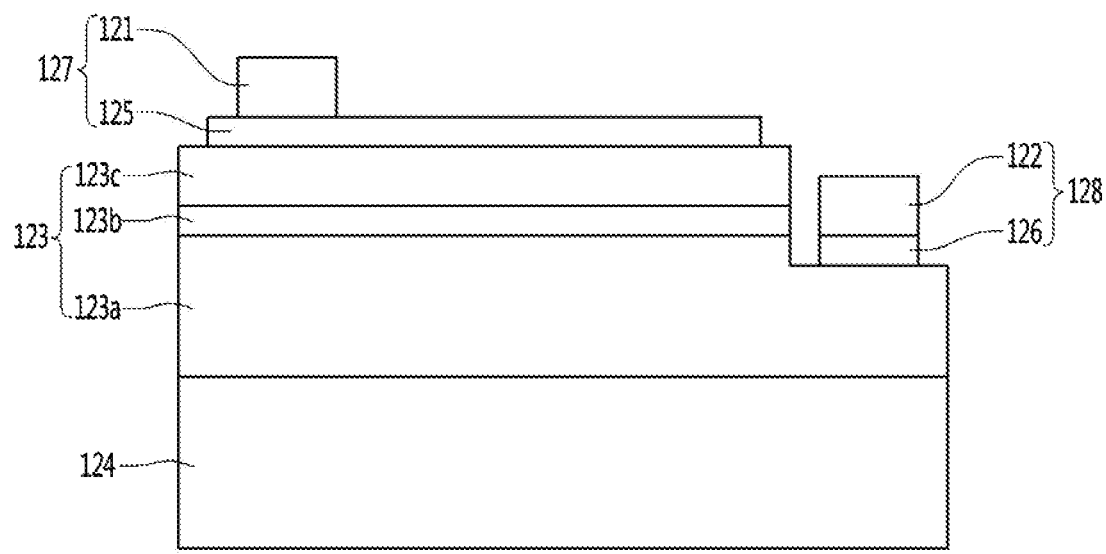
[FIG. 20]
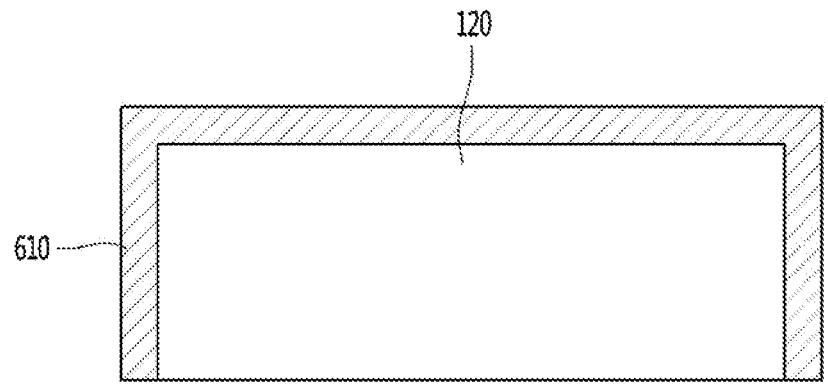

【FIG. 21】
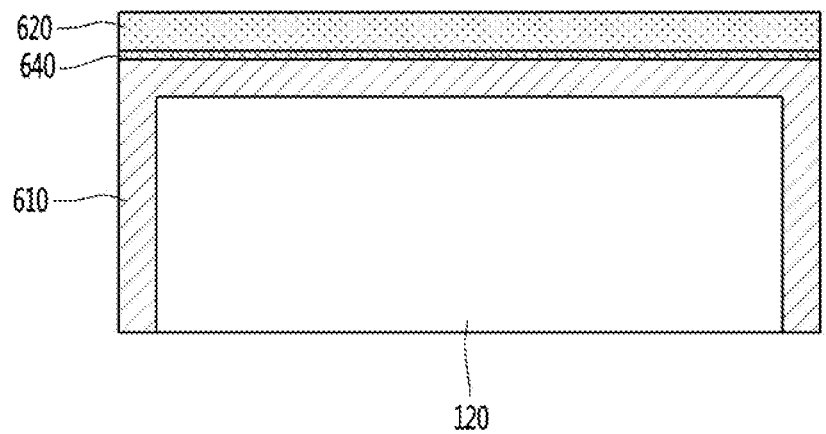
【FIG. 22】
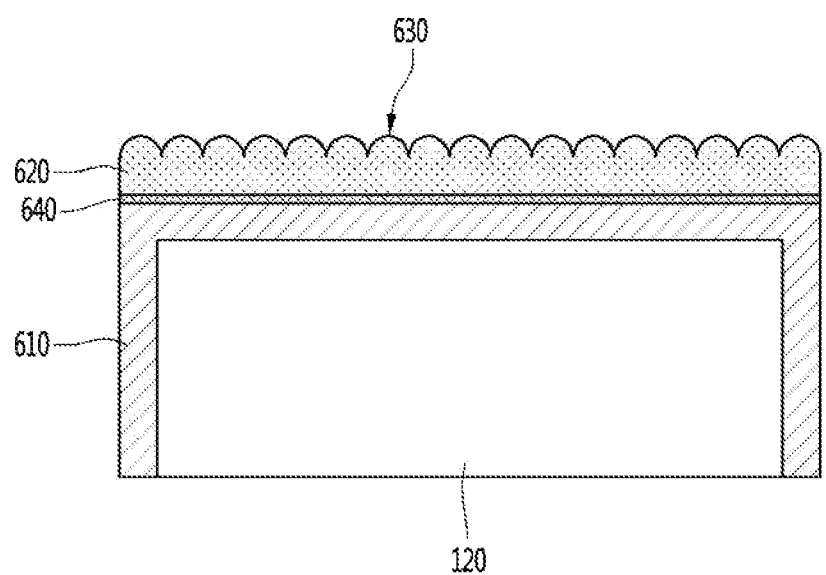

[FIG. 23]
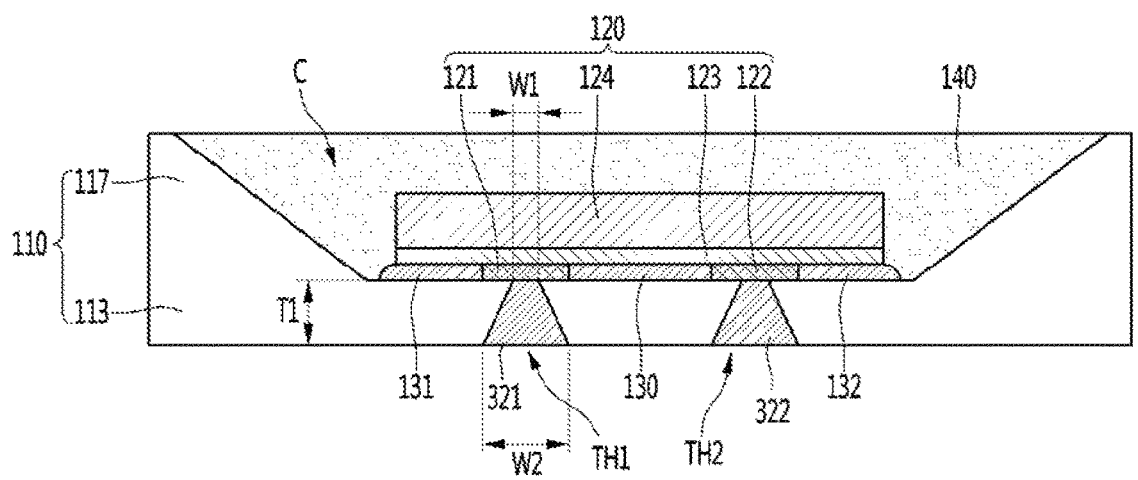
[FIG. 24]
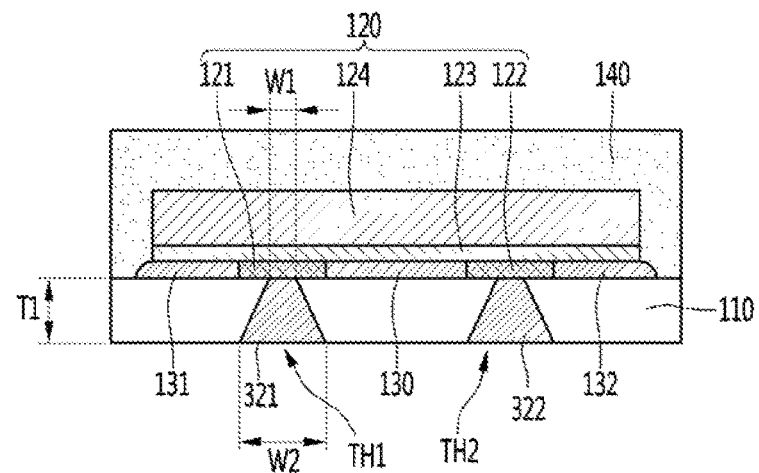

[FIG. 25]
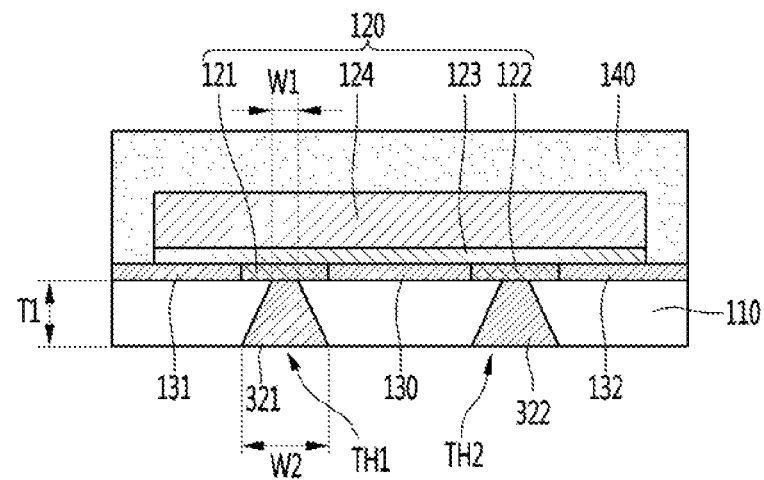
[FIG. 26]
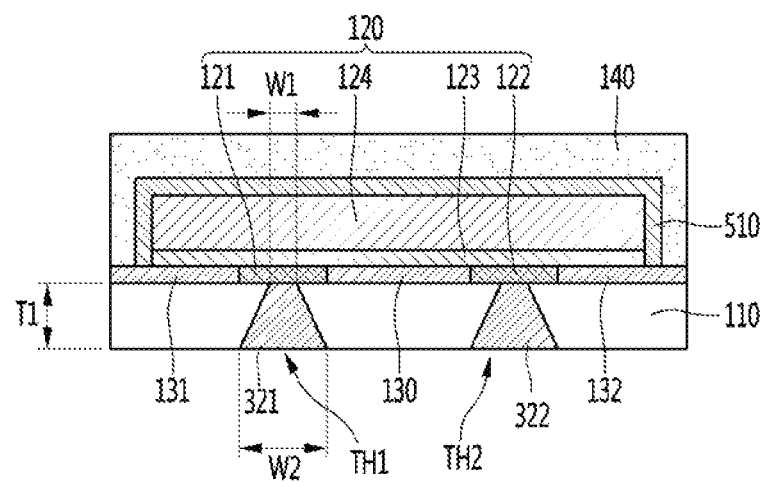

[FIG. 27]
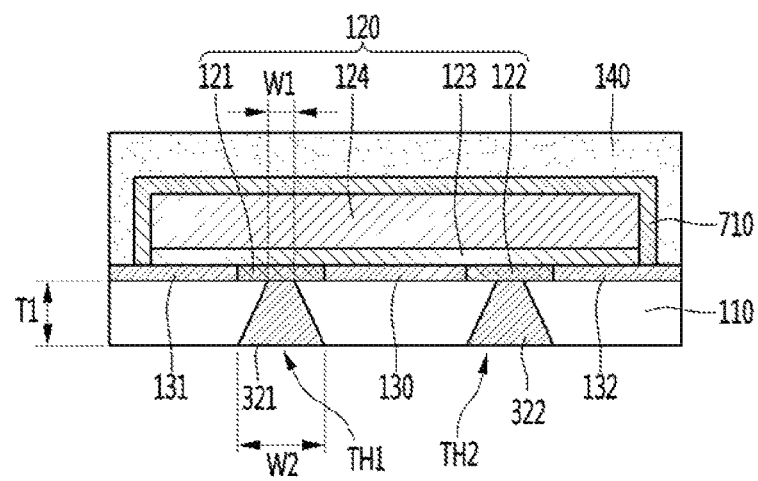
[FIG. 28]
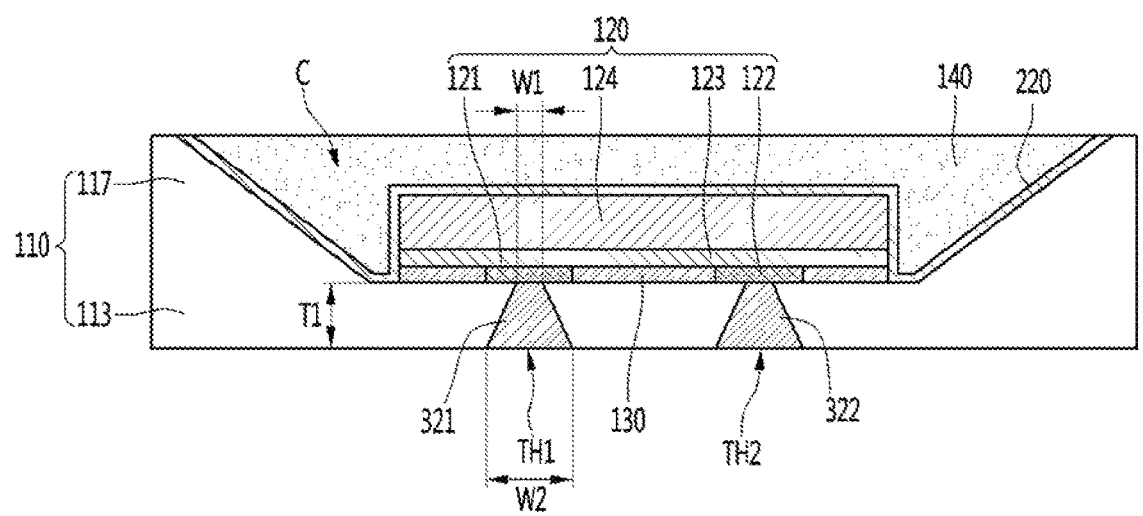

[FIG. 29]
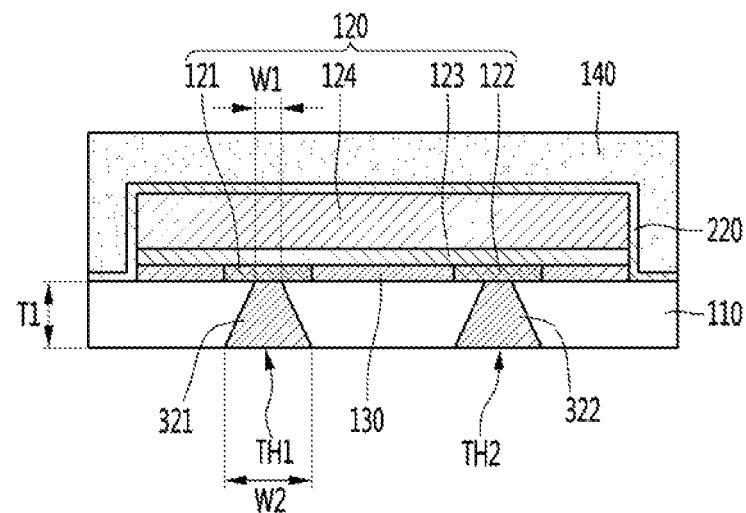
[FIG. 30]
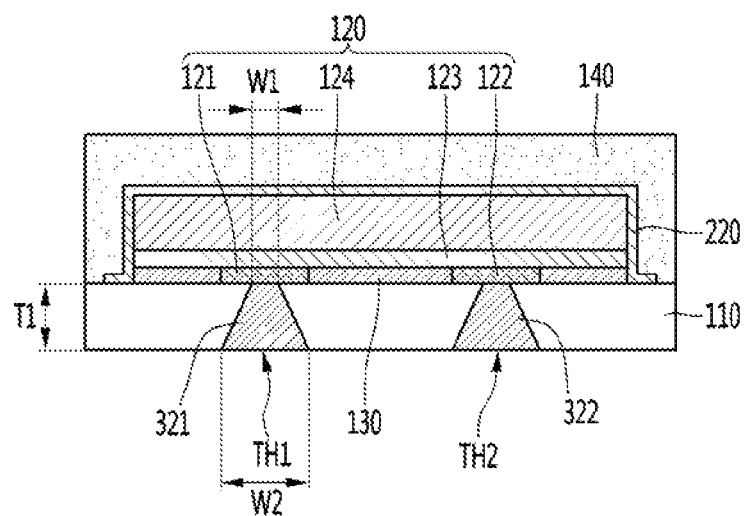

[FIG. 31]
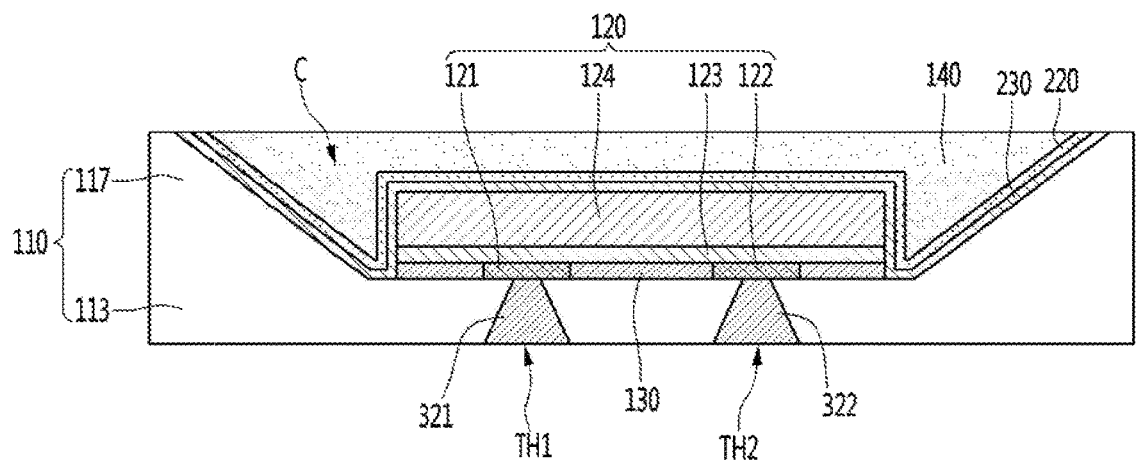
[FIG. 32]
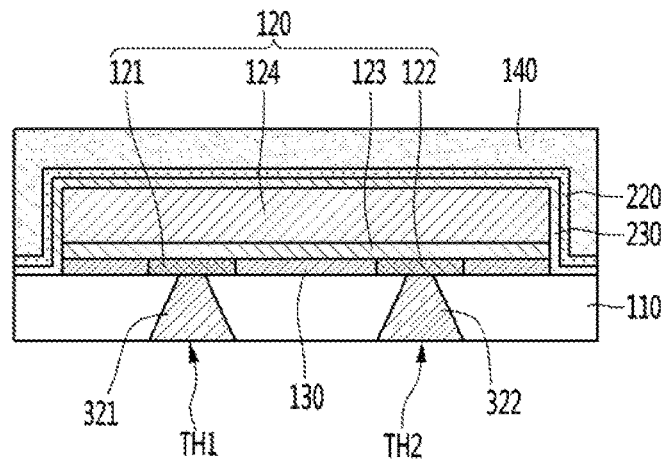

[FIG. 33]
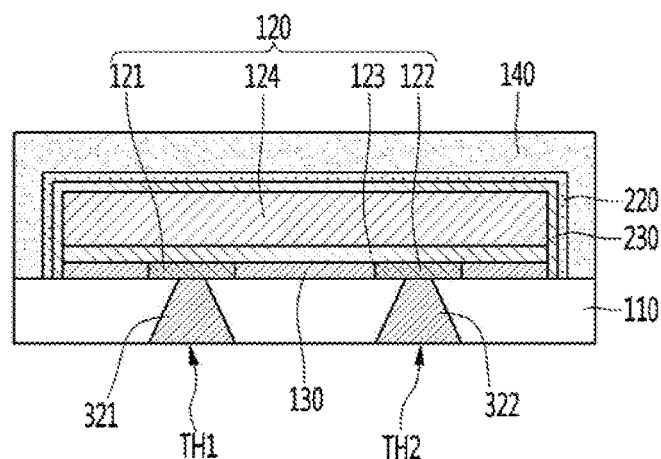
[FIG. 34]
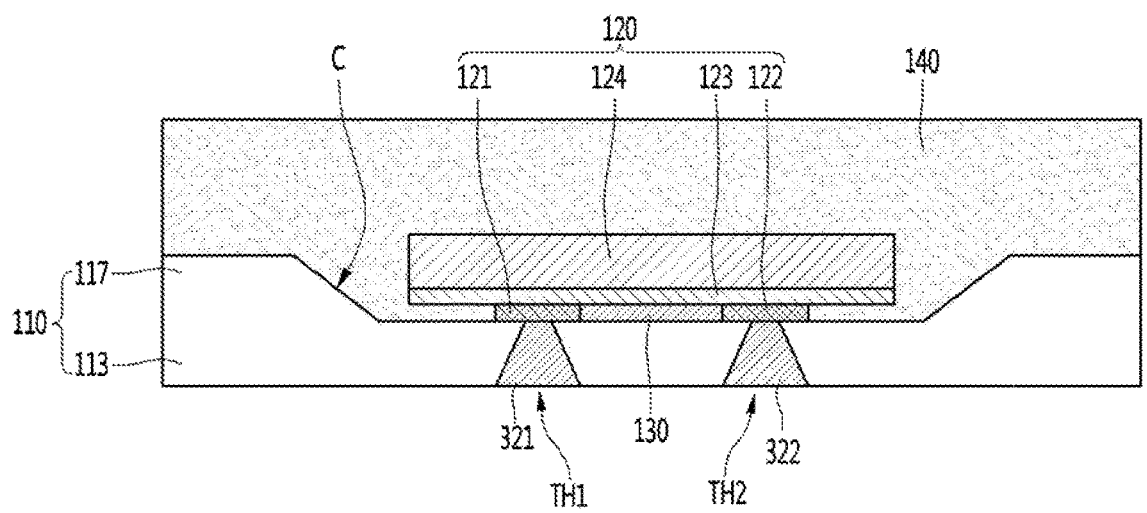

[FIG. 35]
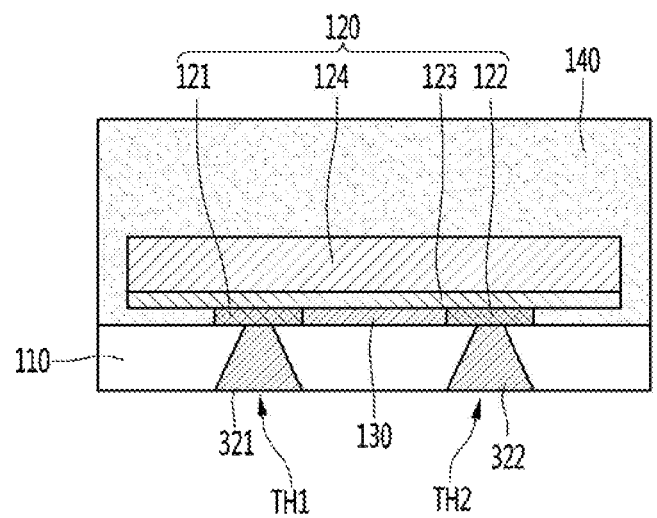
[FIG. 36]
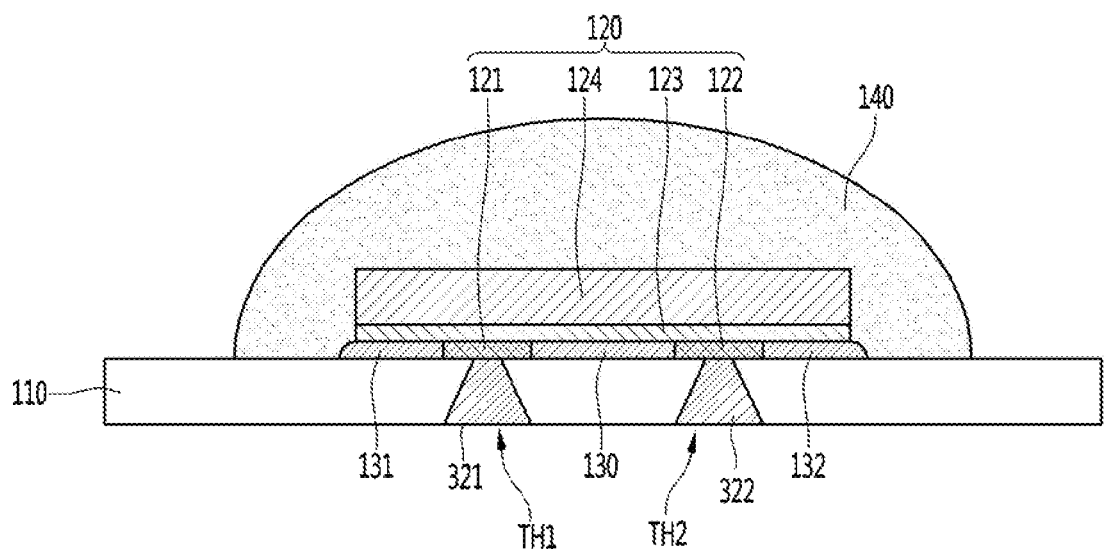

[FIG. 37]
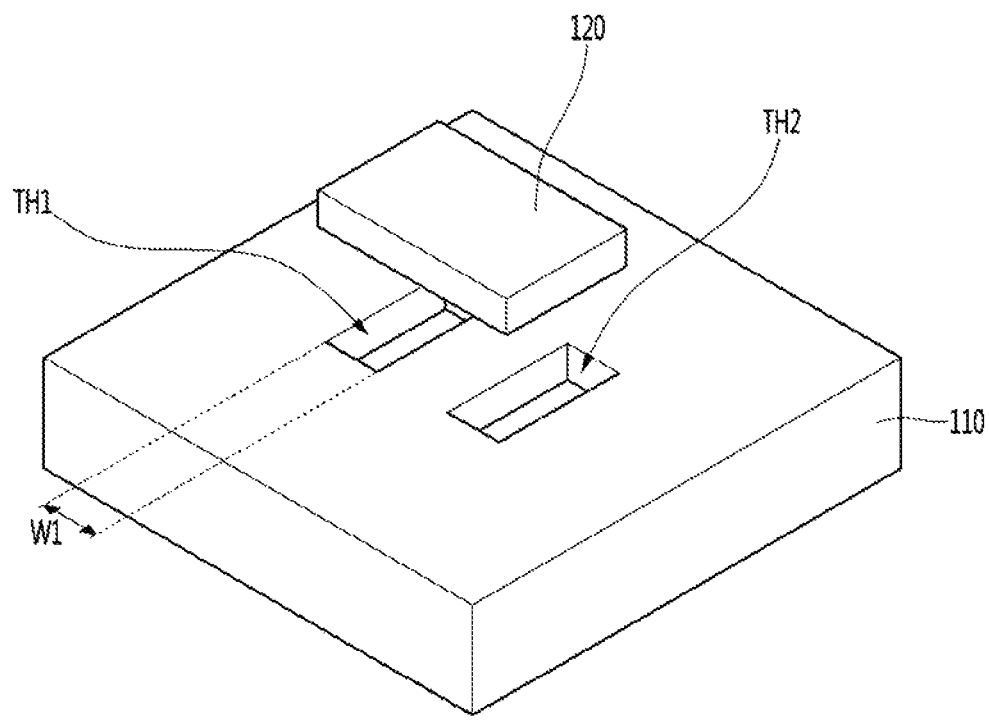

(12) United States Patent — US 11,322,667 B2

LIGHT-EMITTING DEVICE PACKAGE

CROSS REFERENCE TO RELATED APPLICATIONS

This application is the National Phase of PCT International Application No. PCT/KR2018/011185, filed on Sep. 20, 2018, which claims priority under 35 U.S.C. 119(a) to Patent Application No. 10-2017-0122901, filed in the Republic of Korea on Sep. 22, 2017 and Patent Application No. 10-2017-0147410, filed in the Republic of Korea on Nov. 7, 2017, all of which are hereby expressly incorporated by reference into the present application.

FIELD OF THE INVENTION

An embodiment relates to a light emitting device package, a method of manufacturing a light emitting device package, and a light source device.

BACKGROUND ART

A semiconductor device comprising compounds such as GaN and AlGaN has a lot of advantages such as having wide and easily adjustable band gap energy and may be used variously as a light emitting device, a light-receiving device, and various diodes.

In particular, a light emitting device such as a light emitting diode or a laser diode using a compound semiconductor material of Group III-V or Group II-VI of a semiconductor has an advantage that may realize light of various wavelength bands such as red, green, blue, and ultraviolet rays by development of thin film growth technology and device materials. In particular, a light emitting device such as a light emitting diode or a laser diode using a compound semiconductor material of Group III-V or Group II-VI of a semiconductor may realize a white light source with high efficiency by using fluorescent materials or combining colors. Such a light emitting device has advantages of low power consumption, semi-permanent lifetime, fast response speed, safety, and environmental friendliness as compared with conventional light sources such as fluorescent lamps and incandescent lamps.

In addition, when a light-receiving device such as a photo detector or a solar cell is manufactured using a compound semiconductor material of Group III-V or Group II-VI, by developing device materials, light of various wavelength regions from gamma rays to a radio wavelength region may be utilized by absorbing light of various wavelength regions and generating a photocurrent. In addition, such a light receiving device has advantages of fast response speed, safety, environmental friendliness and easy control of device materials, so that it can be easily used for power control or a microwave circuit or communication module.

Accordingly, a semiconductor device has been expanded to a transmitting module of an optical communication means, a light emitting diode backlight which replaces a cold cathode fluorescent lamp (CCFL) constituting a backlight of a liquid crystal display (LCD) device, white light emitting diode lighting device which may replace the fluorescent lamp or the incandescent lamp, automotive headlights, traffic lights, and even sensors sensing gas or fire. In addition, the semiconductor device may be extended to high-frequency application circuits or other power control devices, and even communication modules.

A light emitting device (LED) may be provided, for example, as a p-n junction diode having a characteristic in which electric energy is converted into light energy by using Group III-V or Group II-V elements on the periodic table, and may realize various wavelengths by adjusting a composition ratio of a compound semiconductor.

For example, a nitride semiconductor has received a great interest in a development field of an optical device and a high-power electronic device due to high thermal stability and wide band gap energy thereof. In particular, an ultraviolet (UV) LED, a blue LED, a green LED, a red LED, and the like using the nitride semiconductor are commercialized and used widely.

For example, an ultraviolet light emitting device is a light emitting diode that emits light distributed in a wavelength band of 200 nm to 400 nm, in the wavelength band, a short wavelength may be used for sterilization, purification, or the like, and a long wavelength may be used for an exposure apparatus, a curing apparatus, or the like.

Ultraviolet rays may be classified into three categories of UV-A (315 nm to 400 nm), UV-B (280 nm to 315 nm), and UV-C (200 nm to 280 nm) in a descending order of wavelength. The UV-A (315 nm to 400 nm) region is applied to various fields such as industrial UV curing, printing ink curing, an exposure apparatus, counterfeit discrimination, photocatalytic sterilization, a special lighting system (aquarium/agriculture, etc.), and the like. The UV-B (280 nm to 315 nm) region is used for medical applications, and the UV-C (200 nm to 280 nm) region is applied to air purification, water purification, sterilization products, and the like.

Meanwhile, as a semiconductor device capable of providing high output is required, research on a semiconductor device capable of increasing output by applying high power is being conducted.

In addition, in a light emitting device package, research is being conducted on a method for improving light extraction efficiency of a semiconductor device and improving brightness at a package stage. In addition, in a light emitting device package, research is being conducted on a method for improving a bonding force between a package electrode and a semiconductor device.

In addition, in a light emitting device package. research is being conducted on a method for reducing a manufacturing cost and improving a manufacturing yield by improving process efficiency and changing a structure thereof.

SUMMARY OF THE INVENTION

An embodiment may provide a light emitting device package, a method of manufacturing a light emitting device package, and a light source device that may improve light extraction efficiency and electrical characteristics.

An embodiment may provide a light emitting device package, a method of manufacturing a light emitting device package, and a light source device that may reduce manufacturing cost and improve a manufacturing yield by improving process efficiency and presenting a new package structure.

An embodiment may provide a light emitting device package and a method of manufacturing a light emitting device package that may prevent a re-melting phenomenon from occurring in a bonding region of the light emitting device package while the light emitting device package is re-bonded to a board or the like.

A light emitting device package according to one aspect of an embodiment may comprise: a body comprising a first opening, a second opening, and a cavity; a conductive layer disposed in the first and second openings, respectively; a light emitting device disposed in the cavity; a first resin disposed between the light emitting device and the body; and a wavelength conversion layer disposed on the light emitting device, wherein an upper surface of the conductive layer may be in contact with the light emitting device.

According to the embodiment, the body may comprise a first region in which the light emitting device is disposed, a second region that is coplanar with an upper surface of the cavity, an inclined side portion disposed between the first region and the second region, a first recess disposed in the first region, and a second recess disposed between the first region and the side portion. An upper surface of the second region may be lower than an upper surface of the light emitting device with reference to on a lower surface of the body.

According to the embodiment, the first recess and the second recess may be spaced apart from each other.

According to the embodiment, a second resin may be disposed in the second recess.

According to the embodiment, at least one of the first resin and the second resin may comprise at least one of a reflective material, scattering particles, and a phosphor.

According to the embodiment, the phosphor may comprise $K_2SiF_6:Mn^{4+}$ (KSF).

According to the embodiment, the second resin may be disposed in a closed loop shape along a circumference of each of the first and second openings.

According to the embodiment, the light emitting device package may comprise a conductive material disposed on the body in the first and second openings.

According to the embodiment, the first resin may further comprise a third resin.

According to the embodiment, the third resin may comprise a transmissive adhesive.

According to the embodiment, the first resin may further comprise a third recess to be concave from an upper surface toward a lower surface thereof, and may comprise a third resin disposed in the third recess.

According to the embodiment, the first to third resins may comprise different materials.

According to the embodiment, the first and second recesses may be connected to each other, the first and second resins may be in contact with each other, and the first and second resins may be formed of the same material.

According to the embodiment, the first recess may extend in a first direction between the first and second openings, and the second recess may comprise a side surface parallel to the first direction and a side surface parallel to a second direction that is a direction perpendicular to the first direction.

A light emitting device package according to another aspect of an embodiment may comprise: a body; a light emitting device disposed on the body; and a first resin disposed between the body and the light emitting device. The body may comprise first and second openings spaced apart from each other and passing through the body, and first and second recesses to be concave from an upper surface of the body toward a lower surface of the body. The light emitting device may comprise a first bonding part disposed on the first opening and a second bonding part disposed on the second opening. The first recess may be disposed between the first and second openings. The second recess may be disposed along a circumference of the first and second openings. The first resin may be disposed in the first recess.

A light emitting device package according to still another aspect of an embodiment may comprise: a body comprising a cavity having an inclined surface; a light emitting device disposed on the body; and a fourth resin disposed on the inclined surface of the cavity. The body may comprise first and second openings passing through the body at an upper surface of the body. The light emitting device may comprise a first bonding part disposed on the first opening and a second bonding part disposed on the second opening. The fourth resin may be disposed on an upper surface and a side surface of the light emitting device and an inner surface of the cavity. The fourth resin may comprise methyl-based silicone or phenyl-based silicone.

According to the embodiment, the light emitting device package may further comprise a first resin disposed under the light emitting device, the body may comprise a recess to be concave from the upper surface of the body to the lower surface of the body, the recess may be disposed between the first and second openings, the first resin may be disposed in the recess, and the second resin may comprise a reflective material.

According to the embodiment, the light emitting device package may comprise a first phosphor disposed between the fourth resin and the light emitting device and disposed between the fourth resin and the inclined surface of the cavity.

According to the embodiment, the first phosphor may comprise $K_2SiF_6:Mn^{4+}$ (KSF).

According to the embodiment, the light emitting device package may comprise a second phosphor disposed in the cavity and disposed on the fourth resin.

According to the embodiment, the second phosphor may be formed of a different material from the first phosphor.

According to the embodiment, the second phosphor may be formed of MGF.

According to the embodiment, the first resin may further comprise a third resin, and the third resin may be disposed to be surrounded by the first bonding part, a lower surface of the light emitting device, and an upper surface of the first body along a circumference of the first bonding part and the second bonding part.

According to the embodiment, the light emitting device package may further comprise a first resin part surrounding the light emitting device and a second resin part disposed on an upper surface of the first resin part, and the second resin part may comprise one of methyl-based silicone and phenyl-based silicone, and scattering particles.

According to the embodiment, the second resin part may comprise a plurality of patterns disposed on an upper surface thereof.

ADVANTAGEOUS EFFECTS

According to a light emitting device package and a method of manufacturing a light emitting device package according to an embodiment, there are advantages that light extraction efficiency, electrical characteristics, and reliability can be improved.

According to the light emitting device package and the method of manufacturing a light emitting device package according to the embodiment, there are advantages that can reduce a manufacturing cost and improve a manufacturing yield by improving process efficiency and presenting a new package structure.

The light emitting device package according to the embodiment has an advantage that can prevent a reflector from being discolored by providing a body with high reflectivity, and can improve the reliability of the light emitting device package.

According to the light emitting device package and the method of manufacturing a light emitting device package according to the embodiment, there are advantages that can prevent a re-melting phenomenon from occurring in a bonding region of the light emitting device package while the light emitting device package is re-bonded to a board or the like or heat-treated.

Additional areas of applicability of the embodiments will become apparent from the detailed description below. However, various changes and modifications within the spirit and scope of the embodiments may be apparent to those skilled in the art, and thus it should be understood that specific embodiments such as detailed descriptions and the preferred embodiments are merely illustrative.

BRIEF DESCRIPTION OF THE DRAWINGS

FIG. 1 shows a light emitting device package according to a first embodiment of the present invention.

FIG. 2 is an exploded perspective view describing the light emitting device package according to the first embodiment of the present invention.

FIG. 3 is a view describing an arrangement relationship between a recess and an opening of a body of the light emitting device package and the light emitting device according to the first embodiment of the present invention.

FIG. 4 is another exploded perspective view describing the light emitting device package according to the first embodiment of the present invention.

FIGS. 5 to 8 are views describing a method of manufacturing a light emitting device package according to an embodiment of the present invention.

FIG. 9 shows a light emitting device package according to a second embodiment of the present invention.

FIG. 10 shows a light emitting device package according to a third embodiment of the present invention.

FIG. 11 shows a light emitting device package according to a fourth embodiment of the present invention.

FIG. 12 is a view describing an arrangement relationship between a recess and an opening of a body of the light emitting device package and the light emitting device according to the fourth embodiment of the present invention.

FIG. 13 shows a light emitting device package according to a fifth embodiment of the present invention.

FIG. 14 shows a light emitting device package according to a sixth embodiment of the present invention.

FIG. 15 shows a light emitting device package according to a seventh embodiment of the present invention.

FIG. 16 shows a light emitting device package according to an eighth embodiment of the present invention.

FIG. 17 shows a light emitting device package according to a ninth embodiment of the present invention.

FIG. 18 is a plan view showing a light emitting device according to the first embodiment of the present invention.

FIG. 19 is a cross-sectional view taken along line F-F of the light emitting device shown in FIG. 18.

FIG. 20 shows a light emitting device according to the second embodiment of the present invention.

FIG. 21 shows a light emitting device according to the third embodiment of the present invention.

FIG. 22 shows a light emitting device according to the fourth embodiment of the present invention.

FIG. 23 shows a light emitting device package according to a tenth embodiment of the present invention.

FIG. 24 shows a light emitting device package according to an eleventh embodiment of the present invention.

FIG. 25 shows a light emitting device package according to a twelfth embodiment of the present invention.

FIG. 26 shows a light emitting device package according to a thirteenth embodiment of the present invention.

FIG. 27 shows a light emitting device package according to a fourteenth embodiment of the present invention.

FIG. 28 shows a light emitting device package according to a fifteenth embodiment of the present invention.

FIG. 29 shows a light emitting device package according to a sixteenth embodiment of the present invention.

FIG. 30 shows a light emitting device package according to a seventeenth embodiment of the present invention.

FIG. 31 shows a light emitting device package according to an eighteenth embodiment of the present invention.

FIG. 32 shows a light emitting device package according to a nineteenth embodiment of the present invention.

FIG. 33 shows a light emitting device package according to a twentieth embodiment of the present invention.

FIG. 34 shows a light emitting device package according to a twenty first embodiment of the present invention.

FIG. 35 shows a light emitting device package according to a twenty second embodiment of the present invention.

FIG. 36 shows a light emitting device package according to a twenty third embodiment of the present invention.

FIG. 37 shows a shape of an opening applied to a light emitting device package according to an embodiment of the present invention.

DETAILED DESCRIPTION OF EMBODIMENTS OF THE INVENTION

Hereinafter, embodiments will be described with reference to the accompanying drawings. In the description of embodiments, it will be understood that when a layer (or film), region, pattern or structure is referred to as being "on/over" or "under" another substrate, layer (or film), region, pad or pattern, the terminologies of "on/over" and "under" comprise both the meanings of "directly" and "by interposing another layer (indirectly)". Further, the reference with respect to on/over" or "under" each layer will be described with reference to the drawings, but is not limited to the embodiments.

Hereinafter, a light emitting device package and a method of manufacturing a light emitting device package according to an embodiment will be described in detail with reference to the accompanying drawings. Hereinafter, it will be described based on a case in which a light emitting device is applied as an example of a semiconductor device.

A light emitting device package according to a first embodiment of the present invention will be described with reference to FIGS. 1 to 4. FIG. 1 shows the light emitting device package according to the first embodiment, FIG. 2 is an exploded perspective view describing the light emitting device package according to the first embodiment, FIG. 3 is a view describing an arrangement relationship between a recess and an opening of a body of the light emitting device package and the light emitting device according to the first embodiment, and FIG. 4 is another exploded perspective view describing the light emitting device package according to the first embodiment.

A light emitting device package 100 according to the first embodiment may comprise a body 110 and a light emitting device 120, as shown in FIGS. 1 to 4.

The body 110 may comprise a first body 113 and a second body 117. The second body 117 may be disposed on the first body 113. The second body 117 may be disposed at a circumference of an upper surface of the first body 113. The second body 117 may provide a cavity C on the upper surface of the first body 113.

As an example, the first body 113 and the second body 117 may be integrally formed with each other. As another example, the first body 113 and the second body 117 may be coupled after being formed separately from each other. For this coupling, one of the first body 113 and the second body 117 may be provided with a latching groove, and the other may be provided with a latching protrusion.

In other words, the first body 113 may be referred to as a lower body, and the second body 117 may be referred to as an upper body. In addition, according to the embodiment, the body 110 may not comprise the second body 117 providing the cavity C, but may comprise only the first body 113 providing a flat upper surface.

The second body 117 may reflect light emitted from the light emitting device 120 in an upward direction. The second body 117 may be disposed to be inclined with respect to the upper surface of the first body 113.

The body 110 may comprise the cavity C. The cavity C may comprise a bottom surface and a side surface inclined to an upper surface of the body 110 from the bottom surface.

According to the embodiment, the body 110 may be provided as a structure with the cavity C, or may be provided in a structure with a flat upper surface without the cavity C.

For example, the package body 110 may be formed of at least one selected from the group including polyphthalamide (PPA), polychloro tri phenyl (PCT), liquid crystal polymer (LCP), polyamide 9T (PA9T), silicone, epoxy molding compound (EMC), silicone molding compound (SMC), ceramic, photo sensitive glass (PSG), sapphire ($Al_2O_3$), and the like. In addition, the package body 110 may comprise a high refractive index filler such as $TiO_2$ and $SiO_2$.

According to the embodiment, the light emitting device 120 may comprise a first bonding part 121, a second bonding part 122, a light emitting structure 123, and a substrate 124.

The light emitting device 120 may comprise the light emitting structure 123 disposed under the substrate 124. The light emitting structure 123 may comprise a first conductivity type semiconductor layer, a second conductivity type semiconductor layer, and an active layer disposed between the first conductivity type semiconductor layer and the second conductivity type semiconductor layer. The first bonding part 121 may be electrically connected to the first conductivity type semiconductor layer. In addition, the second bonding part 122 may be electrically connected to the second conductivity type semiconductor layer.

The light emitting device 120 may be disposed on the body 110. Specifically, the light emitting device 120 may be disposed on the first body 113. The light emitting device 120 may be disposed in the cavity C provided by the second body 117. Therefore, the light emitting device 120 may be surrounded by the second body 117.

The first bonding part 121 may be disposed on a lower surface of the light emitting device 120. The second bonding part 122 may be disposed on the lower surface of the light emitting device 120. The first bonding part 121 and the second bonding part 122 may be disposed to be spaced apart from each other on the lower surface of the light emitting device 120.

The first bonding part 121 may be disposed between the light emitting structure 123 and the body 113. The second bonding part 122 may be disposed between the light emitting structure 123 and the body 113.

The first bonding part 121 and the second bonding part 122 may be formed in a single layer or multiple layers by using at least one material selected from the group including Ti, Al, Sn, In, Ir, Ta, Pd, Co, Cr, Mg, Zn, Ni, Si, Ge, Ag, Ag alloy, Au, Hf, Pt, Ru, Rh, Sn, Cu, ZnO, IrOx, RuOx, NiO, RuOx/ITO, Ni/IrOx/Au, Ni/IrOx/Au/ITO, or an alloy thereof.

Meanwhile, the light emitting device package 100 according to the first embodiment may comprise a first opening TH1 and a second opening TH2, as shown in FIGS. 1 to 4.

The body 110 may comprise the first opening TH1 passing through from the bottom surface of the cavity C to the body 110, specifically, the lower surface of the first body 113. The package body 110 may comprise the second opening TH2 passing through from the bottom surface of the cavity C to the body 110, specifically, the lower surface of the first body 113.

The first opening TH1 may be provided at the first body 113. The first opening TH1 may be provided by passing through the first body 113. The first opening TH1 may be provided by passing through the upper surface and the lower surface of the body 113 in a first direction. The first direction may be a direction from the upper surface toward the lower surface of the first body 113.

The first opening TH1 may be disposed under the first bonding part 121 of the light emitting device 120. The first opening TH1 may be provided to be overlapped with the first bonding part 121 of the light emitting device 120. The first opening TH1 may be provided to be overlapped with the first bonding part 121 of the light emitting device 120 in the first direction from the upper surface of the body 113 toward the lower surface thereof.

The second opening TH2 may be provided at the body 113. The second opening TH2 may be provided by passing through the body 113. The second opening TH2 may be provided by passing through an upper surface and a lower surface of the body 113 in the first direction.

The second opening TH2 may be disposed under the second bonding part 122 of the light emitting device 120. The second opening TH2 may be provided to be overlapped with the second bonding part 122 of the light emitting device 120. The second opening TH2 may be provided to be overlapped with the second bonding part 122 of the light emitting device 120 in the first direction from the upper surface of the body 113 toward the lower surface thereof.

The first opening TH1 and the second opening TH2 may be disposed to be spaced apart from each other. The first opening TH1 and the second opening TH2 may be disposed to be spaced apart from each other under the lower surface of the light emitting device 120.

According to the embodiment, an area of the first bonding part 121 may be equal to or larger than that of the first opening TH1. An area of the second bonding part 122 may be equal to or larger than that of the second opening TH2.

According to the embodiment, a width W1 of an upper region of the first opening TH1 may be provided to be smaller than or equal to that of the first bonding part 121. In addition, a width of an upper region of the second opening TH2 may be provided to be smaller than or equal to that of the second bonding part 122.

In addition, the width W1 of the upper region of the first opening TH1 may be provided to be smaller than or equal to a width W2 of a lower region of the first opening TH1. Furthermore, the width of the upper region of the second opening TH2 may be provided to be smaller than or equal to a width of a lower region of the second opening TH2.

The first opening TH1 may be provided in an inclined shape in which a width gradually decreases as toward the upper region from the lower region. The second opening TH2 may be provided in an inclined shape in which a width gradually decreases as toward the upper region from the lower region.

However, the present invention is not limited thereto, and an inclined surface between the upper and lower regions of the first and second openings TH1 and TH2 may have a plurality of inclined surfaces having different slopes, and the inclined surface may be disposed to have a curvature. A width between the first opening TH1 and the second opening TH2 in a lower surface region of the body 113 may be provided at several hundreds of micrometers. The width between the first opening TH1 and the second opening TH2 in the lower surface region of the body 113 may be provided at, as an example, 100 micrometers to 150 micrometers.

Alternatively, the first and/or second openings TH1 and TH2 may have surfaces parallel to the first direction.

A depth T1 of the first opening TH1 may be provided to correspond to a thickness of the first body 113. The depth T1 of the first opening TH1 may be provided at a thickness capable of maintaining a stable strength of the first body 113.

For example, the depth T1 of the first opening TH1 may be provided at several hundreds of micrometers. The depth T1 of the first opening TH1 may be provided at 180 micrometers to 220 micrometers. For example, the depth T1 of the first opening TH1 may be provided at 200 micrometers.

A distance between the first opening TH1 and the second opening TH2 in a lower surface region of the first body 113 may be selected to be provided more than a predetermined distance in order to prevent a short-circuit between the bonding parts when the light emitting device package 100 according to the first embodiment is mounted later on a circuit board, a submount, or the like.

As shown in FIG. 1, the light emitting device package 100 according to the embodiment may comprise a first conductive layer 321 and a second conductive layer 322. The first conductive layer 321 may be disposed to be spaced apart from the second conductive layer 322.

The first conductive layer 321 may be provided at the first opening TH1. The first conductive layer 321 may be disposed under the first bonding part 121. Therefore, a width of the first conductive layer 321 may increase from an upper side of the first opening TH1 toward the lower side. The width of the first conductive layer 321 at the upper side of the first opening TH1 may be provided to be smaller than that of the first bonding part 121.

The first bonding part 121 may have a width of a second direction perpendicular to the first direction in which the first opening TH1 is formed. The width of the first bonding part 121 may be provided to be greater than that of the second direction of the first opening TH1.

The first conductive layer 321 may be disposed to be in direct contact with the lower surface of the first bonding part 121. The first conductive layer 321 may be electrically connected to the first bonding part 121. The first conductive layer 321 may be disposed to be surrounded by the first body 113.

The second conductive layer 322 may be provided at the second opening TH2. The second conductive layer 322 may be disposed under the second bonding part 122. Therefore, a width of the second conductive layer 322 may increase from an upper side of the second opening TH2 toward the lower side. The width of the second conductive layer 322 at the upper side of the second opening TH2 may be provided to be smaller than that of the second bonding part 122.

The second bonding part 122 may have a width of a second direction perpendicular to the first direction in which the second opening TH2 is formed. The width of the second bonding part 122 may be provided to be greater than that of the second direction of the second opening TH2.

The second conductive layer 322 may be disposed to be in direct contact with the lower surface of the second bonding part 122. The second conductive layer 322 may be electrically connected to the second bonding part 122. The second conductive layer 322 may be disposed to be surrounded by the first body 113.

The first conductive layer 321 and the second conductive layer 322 may comprise one material selected from the group including Ag, Au, Pt, Sn, Cu or an alloy thereof. However, the present invention is not limited thereto, and a material capable of securing a conductive function may be used in the first conductive layer 321 and the second conductive layer 322.

For example, the first conductive layer 321 and the second conductive layer 322 may be formed by using a conductive paste. The conductive paste may comprise a solder paste, a silver paste, or the like, and may be composed of multiple layers of different materials, or multiple layers or a single layer composed of alloys. As an example, the first conductive layer 321 and the second conductive layers 322 may comprise a SAC (Sn—Ag—Cu) material.

According to the embodiment, the first conductive layer 321 may be electrically connected to the first bonding part 121, and the second conductive layer 322 may be electrically connected to the second bonding part 122. For example, external power may be supplied to the first conductive layer 321 and the second conductive layer 322, and thus the light emitting device 120 may be driven.

The light emitting device package 100 according to the first embodiment may comprise recesses R10, R11, and R12, as shown in FIGS. 1 to 4. The recesses R10, R11, and R12 may be provided to be concave from the upper surface of the first body 113, that is, at the bottom surface of the cavity C toward the lower surface of the body 110. The recesses R10, R11, R12 may be referred to as a groove.

As an example, a depth d1 of the recesses R10, R11, R12 may be provided at several tens of micrometers. The depth d1 of the recesses R10, R11, R12 may be provided at 40 micrometers to 60 micrometers.

In addition, a width W4 of the recesses R10, R11, R12 may be provided at several hundreds of micrometers. The width W4 of the recesses R10, R11, and R12 may be provided to be narrower than a distance between the first bonding part 121 and the second bonding part 122. The width W4 of the recesses R10, R11, R12 may be provided at 140 micrometers to 160 micrometers. As an example, the width W4 of the recesses R10, R11, R12 may be provided at 150 micrometers.

A depth of the first recess R10 may be different from that of the second recess R11 or the third recess R12, but the embodiment is not limited thereto.

For example, a depth d1 of the first recess R10 may be 10% to 50% of the thickness T1 of the first body 113. When the depth d1 of the first recess R10 is 10% or more of the thickness T1 of the first body 113, reflectance of the first resin 130 provided to the first recess R10 later is increased so that light traveled downward from the light emitting device 120 is not incident on the first body 113 via the first resin 130, thereby improving the light reflectance. When the depth d1 of the first recess R10 is 50% or less of the thickness T1 of the first body 113, a thickness T11-d1 of the first body 113 may be ensured to maintain a stable strength.

The first recess R10 may be provided on the upper surface of the first body 113. The first recess R10 may be provided between the first opening TH1 and the second opening TH2. One side of the first recess R10 may be spaced apart from the first opening TH1. The other side of the first recess R10 may be spaced apart from the second opening TH2. One side of the first recess R10 may be spaced apart from the first bonding part 121. The other side of the first recess R10 may be spaced apart from the second bonding part 122. The first recess R10 may be provided to be concave in a first direction from the upper surface of the first body 113 toward the lower surface thereof.

The first recess R10 may be provided under the light emitting device 120, and may be provided on the first body 113 between the first bonding part 121 and the second bonding part 122. The first recess R10 may be provided under the light emitting device 120 to extend in a short axis direction of the light emitting device 120.

The second recess R11 and the third recess R12 may be provided at a periphery of the light emitting device 120. For example, the second recess R11 may be provided on the first body 113 between the second body 117 adjacent to the first opening TH1 and the first opening TH1. For example, the third recess R12 may be provided on the first body 113 between the second body 117 adjacent to the second opening TH2 and the second opening TH2.

A part of the second recess R11 and the third recess R12 may be disposed to be overlapped with the light emitting device 120, but the embodiment is not limited thereto.

As an example, the second recess R11 and the third recess R12 may be provided in a closed loop shape under the light emitting device 120. That is, as shown in FIG. 2, the second recess R11 and the third recess R12 may be connected to each other to have a closed loop shape. In this case, the first recess R10 may be surrounded by the second recess R11 and the third recess R12. That is, the first recess R10 may be provided inside the closed loop formed by the second recess R11 and the third recess R12. Therefore, the first recess R10 may be provided to be spaced apart from the second recess R11 and the third recess R12. The first opening TH1 and the second opening TH2 may also be provided inside the closed loop formed by the second recess R11 and the third recess R12.

As another example, the second recess R11 and the third recess R12 may be connected to the first recess R10 to be provided in a closed loop shape. That is, a first closed loop shape may be formed by the second recess R11 and the first recess R10, and a second closed loop shape may be formed by the third recess R12 and the first recess R10. In this case, the first opening TH1 may be surrounded by the second recess R11 and the first recess R10, and the second opening TH2 may be surrounded by the third recess R12 and the first recess R10. In other words, the first opening TH1 may be provided inside the first closed loop and the second opening TH2 may be provided inside the second closed loop.

The light emitting device package 100 according to the first embodiment may comprise resins 130, 131, and 132 as shown in FIG. 1.

The resins 130, 131, and 132 may be disposed in the recesses R10, R11, and R12. For example, the first resin 130 may be provided in the first recess R10. For example, the second resin 131 may be provided in the second recess R11. For example, the third resin 132 may be provided in the third recess R12. For example, the first resin 130 may be provided in the first recess R10, and may be provided on the first body 113 between the first bonding part 121 and the second bonding part 122. For example, the second resin 131 may be provided in the second recess R11, and may be provided on the first body 113 between the first bonding part 121 and one end of the light emitting device 120. For example, the third resin 132 may be provided in the third recess R12, and may be provided on the first body 113 between the second bonding part 122 and the other end of the light emitting device 120.

As an example, the first resin 130 may comprise a material different from that of the second resin 131 or the third resin 132. As shown in FIG. 2, when the first recess R10 is provided to be spaced apart from the second or third recess R11 or R12, the first resin 130 may be provided in the first recess R10. The second resin 131 may be provided in the second recess R11, and the third resin 132 may be provided in the third recess R12. The second resin 131 and the third resin 132 may comprise the same material.

As another example, the first resin 130 may comprise the same material as the material of the second resin 131 or the third resin 132. As shown in FIG. 4, when the first to third recesses R10, R11, and R12 are connected to each other to provide a closed loop shape, a resin containing the same material may be provided in the first to third recesses R10, R11, and R12. Therefore, the first to third resins 130, 131, and 132 may also have a closed loop shape.

The first to third resins 130, 131, and 132 may also be referred to as an insulating layer, a reflective layer, an insulating reflective layer, and/or an adhesive layer.

For example, the first to third resins 130, 131, and 132 may comprise an insulating material. Specifically, the first to third resins 130, 131, and 132 may comprise at least one of an epoxy-based material, a silicone-based material, and a hybrid material including an epoxy-based material and a silicone-based material. In addition, the first to third resins 130, 131, and 132 may reflect light emitted from the light emitting device 120.

For example, the first to third resins 130, 131, and 132 may comprise a reflective material. Specifically, the first to third resins 130, 131, and 132 may comprise white silicone having a high reflection function. Accordingly, light traveling downward from the light emitting device 120 may be reflected upward to improve light efficiency. In order to enhance the reflectance, scattering particles such as $TiO_2$, $SiO_2$, etc. may be added to the white silicone. For example, the first to third resins 130, 131, and 132 may comprise the white silicone having the high reflection function and a wavelength conversion material. As the wavelength conversion material, a phosphor or a quantum dot may be used. For example, light may be converted to light of blue wavelength, light of green wavelength, or light of red wavelength, depending on whether a certain phosphor or quantum dot is used. Not only the light traveled downward from the light emitting device 120 may be reflected upward but also a part of the light traveled downward may be converted to light of another wavelength by the first to third resins 130, 131, and 132 comprising the white silicone and the wavelength conversion material. Therefore, the light efficiency may be improved and a high color reproducibility may be realized. For example, the first to third resins 130, 131, and 132 may comprise the white silicone having the high reflection function and $K_2SiF_6:Mn^{4+}$ (hereinafter, KSF). KSF may be a red phosphor.

The first to third resins 130, 131, and 132 may provide a stable fixing force between the light emitting device 120 and the first body 113. The second and third resins 131 and 132 may be disposed, for example, in direct contact with the upper surface of the first body 113. In addition, the second and third resins 131 and 132 may be disposed to be in direct contact with the lower surface of the light emitting device 120.

Meanwhile, the depth d1 of the recesses R10, R11, and R12 may be provided at several tens of micrometers. The depth d1 of the recesses R10, R11, R12 may be provided at 40 micrometers to 60 micrometers.

In addition, a width W3 of the recesses R10, R11, and R12 may be provided at several hundreds of micrometers. The width W3 of the recesses R10, R11, and R12 may be provided at 140 micrometers to 160 micrometers. For example, the width W3 of the recesses R10, R11, and R12 may be provided at 150 micrometers.

According to the embodiment, the depth T1 of the first opening TH1 may be provided 2 times to 10 times the depth d1 of the recesses R10, R11, and R12. For example, when the depth T1 of the first opening TH1 is provided at 200 micrometers, the depth d1 of the recesses R10, R11, and R12 may be provided at 20 micrometers to 100 micrometers.

The first and second bonding parts 121 and 122 of the light emitting device 120 may be sealed from the outside by the first to third resins 130, 131, and 132 provided in the recesses R10, R11, and R12. The first to third resins 130, 131, and 132 may be provided in a closed loop shape under the light emitting device 120. That is, the first to third resins 130, 131, and 132 may be provided in a closed loop shape according to a shape of the recesses R10, R11, and R12, as shown in FIGS. 2 to 4. That is, the first to third resins 130, 131, and 132 may be provided in a shape corresponding to the first to third recesses R10, R11, and R12. The recesses R10, R11, and R12 may be provided in a closed loop having a square shape, or may be provided in a closed loop having a circular shape or an elliptical shape.

In addition, the light emitting device package 100 according to the first embodiment may comprise a molding part 140, as shown in FIG. 1. The molding part 140 may be referred to as a resin.

The molding part 140 may be provided on the light emitting device 120. The molding part 140 may be disposed on the first body 113. The molding part 140 may be disposed at the cavity C provided by the second body 117.

The molding part 140 may comprise an insulating material such as silicone or epoxy. In addition, the molding part 140 may comprise wavelength converting means configured to be incident light emitted from the light emitting device 120 and provide wavelength converted light. For example, the molding part 140 may comprise a phosphor, a quantum dot, and the like. MGF may be used as the phosphor. For example, MGF may be $MgF_2:Mn^{2+}$, $(Zn, Mg) F_2:Mn^{2+}$, and $(K, Mg) F_2:Mn^{2+}$.

In addition, according to the embodiment, the light emitting structure 123 may be provided as a compound semiconductor. The light emitting structure 123 may be provided as, for example, a Group II-VI or Group III-V compound semiconductor. As an example, the light emitting structure 123 may be provided with at least two or more elements selected from aluminum (Al), gallium (Ga), indium (In), phosphorus (P), arsenic (As), and nitrogen (N).

The light emitting structure 123 may comprise a first conductivity type semiconductor layer, an active layer, and a second conductivity type semiconductor layer.

The first and second conductivity type semiconductor layers may be implemented as at least one of the Group II-VI or Group III-V compound semiconductors. The first and second conductivity type semiconductor layers may be formed of a semiconductor material having a composition formula of $In_xAl_yGa_{1-x-y}N$ ($0 \le x \le 1$, $0 \le y \le 1$, $0 \le x+y \le 1$). For example, the first and second conductivity type semiconductor layers may comprise at least one selected from the group including GaN, AlN, AlGaN, InGaN, InN, InAlGaN, AlInN, AlGaAs, GaP, GaAs, GaAsP, AlGaInP, and the like. The first conductivity type semiconductor layer may be an n-type semiconductor layer doped with an n-type dopant such as Si, Ge, Sn, Se, or Te. The second conductivity type semiconductor layer may be a p-type semiconductor layer doped with a p-type dopant such as Mg, Zn, Ca, Sr, or Ba.

The active layer may be implemented as a compound semiconductor. The active layer may be implemented as at least one of the Group III-V or Group II-VI compound semiconductors. When the active layer is implemented as a multi-well structure, the active layer may comprise a plurality of well layers and a plurality of barrier layers that are alternately disposed, and the active layer may be disposed as the semiconductor material having a composition formula of $In_xAl_yGa_{1-x-y}N$ ($0 \le x \le 1$, $0 \le y \le 1$, $0 \le x+y \le 1$). For example, the active layer may comprise at least one selected from the group including InGaN/GaN, GaN/AlGaN, AlGaN/AlGaN, InGaN/AlGaN, InGaN/InGaN, AlGaAs/GaAs, InGaAs/GaAs, InGaP/GaP, AlInGaP/InGaP, and InP/GaAs.

According to the embodiment, the first to third resins 130, 131, and 132 may perform a function of stably fixing the light emitting device 120 to the body 110. When viewed from the upper direction of the light emitting device 120, the first to third resins 130, 131, and 132 may be disposed such that the first and second openings TH1 and TH2 are isolated from an outer region in which the molding part 140 is provided.

The second and third resins 131 and 132 may be in contact with side surfaces of the first and second bonding parts 121 and 122 to be disposed at a circumference of the first and second bonding parts 121 and 122. In addition, the second and third resins 131 and 132 may be disposed so as to be in contact with a portion of the lower surface of the light emitting device 120. Therefore, the light emitting device 120 and the first and second bonding parts 121 and 122 may be stably fixed by the second and third resins 131 and 132.

The second and third resins 131 and 132 may prevent the first and second conductive layers 321 and 322 provided at the first and second openings TH1 and TH2 from being separated from the closed loop of the second and third recesses R11 and R12 and flowing in an outer direction of the light emitting device 120.

When viewed from the upper direction of the light emitting device 120, in the case in which the first and second conductive layers 321 and 322 are moved in the outer direction of the light emitting device 120, the first and second conductive layers 321 and 322 may be diffused along the side surface of the light emitting device 120. As described above, when the first and second conductive layers 321 and 322 are moved in the side surface of the light emitting device 120, the first conductivity type semiconductor layer and the second conductivity type semiconductor layer of the light emitting device 120 may be electrically short-circuited. In addition, as described above, when the first and second conductive layers 321 and 322 are moved in the side surface of the light emitting device 120, light extraction efficiency of the light emitting device 120 may be lowered.

However, according to the embodiment, since the inside and the outside may be isolated from each other based on a region in which the second and third recesses R11 and R12 are provided by the second and third resins 131 and 132, it is possible to prevent the first and second conductive layers 321 and 322 from being separated from a region in which the second and third recesses R11 and R12 are provided and moving in the outer direction.

Therefore, according to the light emitting device package 1100 of the embodiment, it is possible to prevent the first and second conductive layers 321 and 322 from moving to the side surface of the light emitting device 120, and to prevent the light emitting device 120 from being short-circuited electrically, thereby improving light extraction efficiency.

In addition, according to the embodiment, the first resin 130 provided in the first recess R10 may be surrounded by the lower surface of the light emitting device 120, the first and second bonding parts 121 and 122, and the first body 113. Accordingly, the first and second openings TH1 and TH2 may be sealed by the first resin 130.

As described above, since the first and second openings TH1 and TH2 may be sealed by the first resin 130, it is possible to prevent the first and second conductive layers 321 and 322 provided at the first and second openings TH1 and TH2 from moving on the upper surface of the first body 113.

Meanwhile, when an amount of the first to third resins 130, 131, and 132 is not sufficiently provided, a partial region of the first resin may move to the second and third recesses R11 and R12 without being filled with the first resin 130 disposed in a region A1 located under the light emitting device 120. In such a case, the first and second conductive layers 321 and 322 are diffused and moved to an empty space of the first recess R10 from which the first resin 130 has passed, and thus the first conductive layer 321 and the second conductive layer 322 may be electrically short-circuited.

However, in selecting the physical properties of the first body 113 according to the embodiment and the physical properties of the first and second conductive layers 321 and 322, a distance by which the first and second conductive layers 321 and 322 are diffused from the upper surface of the first body 113 may be limited by selecting properties having poor adhesiveness with each other. Accordingly, since the distance by which the first and second conductive layers 321 and 322 are moved at the upper surface of the first body 113 may be controlled, the first conductive layer 321 and the second conductive layer 322 in the first region A1 may be prevented from being electrically short-circuited.

FIGS. 5 to 8 are views describing a method of manufacturing a light emitting device package according to an embodiment.

In describing the method of manufacturing the light emitting device package according to the embodiment with reference to FIGS. 5 to 8, a description of contents overlapping with the contents described with reference to FIGS. 1 to 4 may be omitted.

First, according to the method of manufacturing a light emitting device package of the embodiment, as shown in FIG. 5, a body 110 may be provided.

The body 110 may comprise a first body 113 and a second body 117. The body 110 may comprise a first opening TH1 and a second opening TH2. In addition, the body 110 may comprise recesses R10, R11, and R12.

The first opening TH1 may be provided in the first body 113. The first opening TH1 may be provided passing through the first body 113. The first opening TH1 may be provided passing through upper and lower surfaces of the first body 113 in a first direction.

A first conductive layer 321 may be provided in the first opening TH1, and a second conductive layer 322 may be provided in the second opening TH2.

The second opening TH2 may be provided in the first body 113. The second opening TH2 may be provided passing through the first body 113. The second opening TH2 may be provided passing through the upper and lower surfaces of the first body 113 in the first direction.

The first opening TH1 and the second opening TH2 may be spaced apart from each other.

Recesses R10, R11, and R12 may be provided in the first body 113. The recesses R10, R11, and R12 may be provided to be concave from the upper surface of the first body 113 toward the lower surface. The recesses R10, R11, and R12 may be disposed under the light emitting device 120. For example, the recesses R10, R11, and R12 may be provided in a closed loop shape under the light emitting device 120.

Next, according to the method of manufacturing a light emitting device package of the embodiment, a resin material 130a may be provided at the recesses R10, R11, and R12, as shown in FIG. 6.

The resin material 130a may be provided at the recesses R10, R11 and R12 through a dotting method. For example, the resin material 130a may be provided in a predetermined amount at the recesses R10, R11, and R12, and may be provided to overflow the recesses R10, R11, and R12. In addition, according to the method of manufacturing a light emitting device package of the embodiment, the light emitting device 120 may be provided on the first body 113, as shown in FIG. 7.

According to the embodiment, in the process of disposing the light emitting device 120 on the first body 113, the recesses R10, R11, and R12 may also be used to function as a kind of align key.

After the light emitting device 120 is pressed so as to be in contact with the first body 113 and/or the resin material 130a, the resin material 130a is cured, whereby the resin material 130a may be changed to the first to third resins 130, 131, and 132.

In such a case, the light emitting device 120 may be fixed at the first body 113 by the resins 130, 131, and 132. A part of the resins 130, 131, and 132 provided at the recesses R10, R11, and R12 may be moved in a direction of the first bonding part 121 and the second bonding part 122 to be cured. Accordingly, the resins 130, 131, and 132 may be provided at a wide region between the lower surface of the light emitting device 120 and the upper surface of the first body 113, and the fixing force between the light emitting device 120 and the first body 113 may be improved.

The first to third resins 130, 131, and 132 are formed of a reflective material, and thus light traveled downward from the light emitting device 120 may be reflected upward to improve light efficiency. According to the embodiment, the first opening TH1 may be disposed under the first bonding part 121 of the light emitting device 120. The first opening TH1 may be provided to be overlapped with the first bonding part 121 of the light emitting device 120. The first opening TH1 may be provided to be overlapped with the first bonding part 121 of the light emitting device 120 in the first direction from the upper surface of the first body 113 toward the lower surface thereof.

The second opening TH2 may be disposed under the second bonding part 122 of the light emitting device 120. The second opening TH2 may be provided to be overlapped with the second bonding part 122 of the light emitting device 120. The second opening TH2 may be provided to be overlapped with the second bonding part 122 of the light emitting device 120 in the first direction from the upper surface of the first body 113 toward the lower surface thereof.

The resins 130, 131, and 132 may perform a function of stably fixing the light emitting device 120 in the body 110. Further, the resins 130, 131, and 132 may be disposed at the circumference of the first and second bonding parts 121 and 122 in contact with the side surfaces of the first and second bonding parts 121 and 122. The resins 130, 131, and 132 may be disposed such that the first and second openings TH1 and TH2 are isolated from an outer region in which the molding part 140 is provided when viewed from the upper direction of the light emitting device 120.

Next, according to the method of manufacturing a light emitting device package of the embodiment, as shown in FIG. 21, a molding part 140 may be provided on the light emitting device 120. The molding part 140 may be provided at a cavity C of the body 110.

In the above description, FIG. 5 shows that the first and second conductive layers 321 and 322 are provided in the first and second openings TH1 and TH2, respectively, but the embodiment is not limited thereto. That is, the first and second conductive layers 321 and 322 may be formed before or after formation of the molding part 140 in FIG. 8.

The first and second conductive layers 321 and 322 may be formed directly in the first and second openings TH1 and TH2 by a coating method, and may be inserted and fixed to the first and second openings TH1 and TH2 after the first and second conductive layers 321 and 322 are separately formed in advance. In this case, the first and second conductive layers 321 and 322 may be fixed to the first body 113 in the first and second openings TH1 and TH2 by using a metal layer having an adhesive force.

FIG. 9 shows a light emitting device package according to a second embodiment.

The second embodiment is the same as the first embodiment except for metal layers 431 and 432. Therefore, in the second embodiment, components having the same function, structure, or shape as those of the first embodiment will be designated by the same reference numerals and detailed description thereof may be omitted. A description omitted in the second embodiment may be easily understood from the first embodiment.

As shown in FIG. 9, a light emitting device package 100A according to the second embodiment may comprise metal layers 431 and 432.

The metal layers 431 and 432 may be provided at the first opening TH1 and the second opening TH2. The first metal layer 431 may be provided at an inner surface of the first opening TH1, and the second metal layer 432 may be provided at an inner surface of the second opening TH2. That is, the first metal layer 431 may be provided along a circumference of the inner surface of the first opening TH1, and the second metal layer 432 may be provided along a circumference of the inner surface of the second opening TH2.

The first conductive layer 321 may be provided at the first opening TH1, and the second conductive layer 322 may be provided at the second opening TH2. In such a case, the first metal layer 431 may be disposed between the first body 113 and the first conductive layer 321. The second metal layer 432 may be disposed between the first body 113 and the second conductive layer 322.

A portion of the first metal layer 431 may be provided at the lower surface of the first body 113, and a portion of the second metal layer 432 may be provided at the lower surface of the first body 113. A portion of the first metal layer 431 and a portion of the second metal layer 432 disposed at the lower surface of the first body 113 may be disposed to be spaced apart from each other.

The metal layer 430 may be formed of a material having good adhesive properties to the body 110. In addition, the metal layer 430 may be formed of a material having good adhesive properties to the first and second conductive layers 321 and 322.

Accordingly, the first and second conductive layers 321 and 322 may be stably fixed to the first body 113 by the first and second metal layers 431 and 432 in the first and second openings TH1 and TH2.

Meanwhile, in case of the light emitting device packages 100 and 100A according to the embodiment described above, the light emitting device package is described based on a case in which one opening is provided under each of the bonding parts 121 and 122.

However, according to the light emitting device packages 100 and 100A according to another embodiment, a plurality of openings may be provided under each of the bonding parts 121 and 122. In addition, the plurality of openings may have different widths or diameters.

In addition, a shape of the opening according to the embodiment may be provided in various shapes.

For example, the opening according to the embodiment may be provided with the same width from an upper region to a lower region thereof.

In addition, the opening according to the embodiment may be provided in a shape of multi-stepped structure. For example, the openings may be provided in a shape having a different inclination angle of a two stepped structure. Further, the openings may be provided in a shape having a different inclination angle of a three or more stepped structure.

Further, the opening may be provided in a shape in which the width changes as toward the lower region from the upper region. For example, the opening may be provided in a shape having a curvature toward the lower region from the upper region.

In addition, according to the light emitting device packages 100 and 100A according to the embodiment, the body 110 may comprise only the first body 113 having a flat upper surface, and may be provided so as not to comprise the second body 117 disposed on the first body 113.

FIG. 10 shows a light emitting device package according to a third embodiment.

The third embodiment shows an example in which the light emitting device packages 100 and 100A of the first and second embodiments (FIGS. 1 to 9) are mounted on a circuit board 310 and supplied. For example, a light emitting device package 100B mounted on the circuit board 310 according to the third embodiment may be used in a lighting device.

In the third embodiment, components having the same function, structure, or shape as those of the first embodiment and/or the second embodiment will be designated by the same reference numerals and detailed description thereof may be omitted. A description omitted in the third embodiment may be easily understood from the first and second embodiments.

In describing the light emitting device package 100B according to the third embodiment with reference to FIG. 10, a description of contents overlapping with the contents described with reference to FIGS. 1 to 9 may be omitted.

As shown in FIG. 10, the light emitting device package 100B according to the third embodiment may comprise a circuit board 310, a body 110, and a light emitting device 120.

The circuit board 310 may comprise a first pad 311, a second pad 312, and a support substrate 313. The support substrate 313 may be provided with a power supply circuit configured to control driving of the light emitting device 120.

The body 110 may be disposed on the circuit board 310. The first pad 311 and a first bonding part 121 may be electrically connected to each other. The second pad 312 and a second bonding part 122 may be electrically connected to each other.

The first pad 311 and the second pad 312 may comprise a conductive material. For example, the first pad 311 and the second pad 312 may comprise at least a material selected from the group including Ti, Cu, Ni, Au, Cr, Ta, Pt, Sn, Ag, P, Fe, Sn, Zn, and Al or an alloy thereof. The first pad 311 and the second pad 312 may be provided as a single layer or multiple layers.

The light emitting device package 100B according to the third embodiment may comprise a first bonding layer 421 and a second bonding layer 422, as shown in FIG. 10.

The first bonding layer 421 may be electrically connected to the first bonding part 121 in a process in which the body 110 is mounted on the circuit board 310. The second bonding layer 422 may be electrically connected to the second bonding part 122 in the process in which the body 110 is mounted on the circuit board 310.

The first and second bonding layers 421 and 422 may be formed of at least one metal selected from the group including Ti, Cu, Ni, Au, Cr, Ta, Pt, Sn, Ag, and P, and a selective alloy thereof.

According to the embodiment, the first pad 311 and the first conductive layer 321 of the circuit board 310 may be electrically connected each other by the first bonding layer 421. In addition, the second pad 312 and the second conductive layer 322 of the circuit board 310 may be electrically connected each other by the second bonding layer 422.

Meanwhile, according to the embodiment, the first conductive layer 321 and the second conductive layer 322 may be mounted on the circuit board 310 by eutectic bonding. In addition, according to the embodiment, the first and second bonding layers 421 and 422 may not be provided, and the first and second conductive layers 321 and 322 may be electrically connected to the first and second pads 311 and 312, respectively.

In the light emitting device packages 100, 100A, and 100B according to the first to third embodiments, as described with reference to FIG. 10, a conventional lead frame is not applied in forming the body 110.

In case of a light emitting device package to which a conventional lead frame is applied, a process of forming a lead frame is additionally required, but according to the light emitting device packages 100, 100A, and 100B of the first to third embodiments, a process of forming a lead frame is not required. Accordingly, according to the method of manufacturing the light emitting device package according to the embodiment, not only a process time may be shortened but also a material may be saved.

In addition, in the case of the light emitting device package to which the conventional lead frame is applied, a plating process of silver or the like should be added to prevent deterioration of the lead frame, but according to the light emitting device packages 100, 100A, and 100B of the first to third embodiments, a lead frame is not required, and thus an additional process such as silver plating may be omitted. Therefore, the first to third embodiments 100, 100A, and 100B may solve a problem of discoloration of a material such as silver plating, and may reduce a manufacturing cost by an advantage that a process may be omitted. Accordingly, according to the method of manufacturing the light emitting device package of the embodiment, there is an advantage that may reduce a manufacturing cost and improve a manufacturing yield and product reliability.

FIG. 11 shows a light emitting device package according to a fourth embodiment, and FIG. 12 is a view describing an arrangement relationship between a recess, an opening, and a semiconductor device of a body of the light emitting device package according to the fourth embodiment.

The fourth embodiment is the same as the first to third embodiments except for a first resin 220. Therefore, in the fourth embodiment, components having the same function, structure, or shape as those of the first to third embodiments will be designated by the same reference numerals and detailed description thereof may be omitted. A description omitted in the fourth embodiment may be easily understood from the first to third embodiments.

Referring to FIGS. 11 and 12, a light emitting device package 100C according to the fourth embodiment may comprise a body 110 and a light emitting device 120.

The light emitting device 120 may be provided on the body 110. Specifically, the light emitting device 120 may be electrically connected to a first conductive layer 321 and a second conductive layer 322 provided in a first opening TH1 and a second opening TH2 of the body 110.

The body 110 may comprise a first body 113 and a second body 117.

The first opening TH1, the second opening TH2, and a recess R10 may be provided in the first body 113. The recess R10 may be disposed between the first opening TH1 and the second opening TH2.

A second resin 130 may be provided in the recess R10. The second resin 130 may be disposed in the recess R10 of the first body 113 under the light emitting device 120. The second resin 130 may be disposed to be spaced apart from the first opening TH1 or the second opening TH2.

The second resin 130 may also be referred to as an insulating layer, a reflective layer, an insulating reflective layer, and/or an adhesive layer.

For example, the second resin 130 may comprise an insulating material. Specifically, the second resin 130 may comprise at least one of an epoxy-based material, a silicone-based material, and a hybrid material including an epoxy-based material and a silicone-based material. In addition, the second resin 130 may reflect light emitted from the light emitting device 120.

For example, the second resin 130 may comprise a reflective material. Specifically, the second resin 130 may comprise white silicone having a high reflection function. Accordingly, light traveling downward from the light emitting device 120 may be reflected upward to improve light efficiency. In order to enhance the reflectance, scattering particles such as $TiO_2$, $SiO_2$, etc. may be added to the white silicone. For example, the second resin 130 may comprise the white silicone having the high reflection function and a wavelength conversion material. As the wavelength conversion material, a phosphor or a quantum dot may be used. For example, light may be converted to light of blue wavelength, light of green wavelength, or light of red wavelength, depending on whether a certain phosphor or quantum dot is used. Not only the light traveled downward from the light emitting device 120 may be reflected upward but also a part of the light traveled downward may be converted to light of another wavelength by the second resin 130 comprising the white silicone and the wavelength conversion material. Therefore, the light efficiency may be improved and a high color reproducibility may be realized. For example, the first to third resins 130, 131, and 132 may comprise the white silicone having the high reflection function and $K_2SiF_6$:$Mn^{4+}$ (hereinafter, KSF). KSF may be a red phosphor.

The second resin 130 may provide a stable fixing force between the light emitting device 120 and the first body 113.

According to the embodiment, light traveled downward from the light emitting device 120 is reflected upward by the second resin 130, and thus light efficiency may be improved.

As shown in FIG. 11, the light emitting device package 100C according to the fourth embodiment may comprise the first resin 220. The first resin 220 may be referred to as a moisture barrier layer.

The first resin 220 may comprise a material having excellent moisture resistance. The first resin 220 may comprise methyl-based silicone or phenyl-based silicone. After the methyl-based silicone or the phenyl-based silicone is mixed with a binder, the first resin 220 may be formed by being sprayed into a cavity C of the body 110 using a spray coating method and then cured. Spray coating may be performed multiple times to have a predetermined thickness to have moisture resistance properties.

The first resin 220 may be provided, for example, at an upper surface and a side surface of the light emitting device 120. The first resin 220 may be provided at an inclined inner surface of the cavity C of the body 110. Accordingly, even though external moisture penetrates the body 110, it is blocked by the first resin 220 provided at an inclined side surface of the cavity C, thereby protecting the light emitting device 120 from moisture. Even though the external moisture penetrates the molding part 140, it is blocked by the first resin 220 provided at the upper and side surfaces of the light emitting device 120, thereby protecting the light emitting device 120 from moisture.

In addition, the first resin 220 is formed to be in contact with the inclined inner surface of the cavity C of the body 110 as well as the light emitting device 120, and thus the light emitting device 120 may be fixed to the package body 110 more strongly.

As shown in FIG. 11, the light emitting device package 100C according to the fourth embodiment may comprise a third resin 370. The third resin 370 may be referred to as an adhesive layer. The third resin 370 may be formed of a transparent adhesive material.

The third resin 370 may be provided in first to third regions of the first body 113. The first region of the first body 113 may be a region corresponding to a space between the first bonding part 121 and the second bonding part 122. The second region of the first body 113 may be a region corresponding to a space between the first bonding part 121 and one end of the light emitting device 120. The third region of the first body 113 may be a region corresponding to a space between the second bonding part 122 and the other end of the light emitting device 120.

The third resin 370 provided in the first region of the first body 113 may be surrounded by the first bonding part 121 and the second bonding part 122 of the light emitting device 120, a lower surface of the light emitting structure 123, and an upper surface of the second resin 130. That is, the first bonding part 121, the second bonding part 122, the lower surface of the light emitting structure 123, and the upper surface of the second resin 130 may be firmly fixed to each other by the third resin 370.

The third resin 370 provided in the second region of the first body 113 may be surrounded by the first bonding part 121, the lower surface of the light emitting structure 123, and the upper surface of the first body 113. In addition, the third resin 370 provided in the third region of the first body 113 may be surrounded by the second bonding part 122, the lower surface of the light emitting structure 123, and the upper surface of the first body 113. In other words, the third resin 370 may be surrounded by the first bonding part 121, the lower surface of the light emitting structure 123, and the upper surface of the first body 113 along circumferences of the first bonding part 121 and the second bonding part 122.

The resin 370 provided in the second region of the first body 113 or the second region of the first body 113 is optional, and may be omitted as necessary.

The third resin 370 shown in FIG. 11 serves as an adhesive layer so that the light emitting device 120 is fixed to the first body 113.

Alternatively, the third resin 370 may be omitted. In such a case, the light emitting device 120 may be fixed to the first body 113 by the second resin 130. The second resin 130 may be used as an adhesive layer while being a reflective layer.

FIG. 13 shows a light emitting device package according to a fifth embodiment.

The fifth embodiment is the same as the fourth embodiment except for metal layers 431 and 432. Further, a structure in which the metal layers 431 and 432 are added is the same as in the second embodiment. In the fifth embodiment, components having the same function, structure, or shape as those of the first to fourth embodiments will be designated by the same reference numerals and detailed description thereof may be omitted. A description omitted in the fifth embodiment may be easily understood from the first to fourth embodiments.

As shown in FIG. 13, a light emitting device package 100D according to the fifth embodiment may comprise the metal layers 431 and 432.

The metal layers 431 and 432 may be provided at a first opening TH1 and a second opening TH2. The first metal layer 431 may be provided at an inner surface of the first opening TH1, and the second metal layer 432 may be provided at an inner surface of the second opening TH2. That is, the first metal layer 431 may be provided along a circumference of the inner surface of the first opening TH1, and the second metal layer 432 may be provided along a circumference of the inner surface of the second opening TH2.

A first conductive layer 321 may be provided at the first opening TH1, and a second conductive layer 322 may be provided at the second opening TH2. In such a case, the first metal layer 431 may be disposed between a first body 113 and the first conductive layer 321. The second metal layer 432 may be disposed between the first body 113 and the second conductive layer 322.

A portion of the first metal layer 431 may be provided at a lower surface of the first body 113, and a portion of the second metal layer 432 may be provided at the lower surface of the first body 113. A portion of the first metal layer 431 and a portion of the second metal layer 432 disposed at the lower surface of the first body 113 may be disposed to be spaced apart from each other.

The metal layer 430 may be formed of a material having good adhesive properties to a body 110. In addition, the metal layer 430 may be formed of a material having good adhesive properties to the first and second conductive layers 321 and 322.

Accordingly, the first and second conductive layers 321 and 322 may be stably fixed to the first body 113 by the first and second metal layers 431 and 432 in the first and second openings TH1 and TH2.

As shown in FIG. 13, the light emitting device package 100D according to the fifth embodiment may comprise a second resin 130 provided at a recess R10 of the body 110.

As shown in FIG. 13, the light emitting device package 100D according to the fifth embodiment may comprise a first resin 220 provided at an inner surface of a cavity C, that is, a bottom surface and a side surface of the body 110. The first resin 220 may be provided at an upper surface and a side surface of the light emitting device 120.

As shown in FIG. 13, the light emitting device package 100D according to the fifth embodiment may comprise a third resin 370 provided between the light emitting device 120 and the first body 113.

FIG. 14 shows a light emitting device package according to a sixth embodiment.

The sixth embodiment shows an example in which the light emitting device packages 100C and 100D of the fourth and fifth embodiments (FIGS. 11 to 13) are mounted on a circuit board 310 and supplied. For example, a light emitting device package 100E mounted on the circuit board 310 according to the sixth embodiment may be used in a lighting device.

In the sixth embodiment, components having the same function, structure, or shape as those of the fourth embodiment and/or the fifth embodiment will be designated by the same reference numerals and detailed description thereof may be omitted. A description that is omitted in the sixth embodiment may be easily understood from the fourth and fifth embodiments.

In describing the light emitting device package 100E according to the sixth embodiment with reference to FIG. 14, a description of contents overlapping with the contents described with reference to FIGS. 1 to 13 may be omitted.

As shown in FIG. 14, the light emitting device package 100E according to the sixth embodiment may comprise a circuit board 310, a body 110, and a light emitting device 120.

The circuit board 310 may comprise a first pad 311, a second pad 312, and a support substrate 313. The support substrate 313 may be provided with a power supply circuit configured to control driving of the light emitting device 120.

The body 110 may be disposed on the circuit board 310. The first pad 311 and the first bonding part 121 may be electrically connected to each other. The second pad 312 and the second bonding part 122 may be electrically connected to each other.

According to the embodiment, the first pad 311 and the first conductive layer 321 of the circuit board 310 may be electrically connected to each other by a first bonding layer 421. In addition, the second pad 312 and the second conductive layer 322 of the circuit board 310 may be electrically connected by a second bonding layer 422.

Meanwhile, according to the embodiment, the first conductive layer 321 and the second conductive layer 322 may be mounted on the circuit board 310 by eutectic bonding. In addition, according to the embodiment, the first and second bonding layers 421 and 422 may not be provided, and the first and second conductive layers 321 and 322 may be electrically connected to the first and second pads 311 and 312, respectively.

Meanwhile, in FIGS. 11 to 14, it is described that the second resin 130 is provided, but a light emitting device package in which the second resin 130 is omitted is also possible.

In addition, a light emitting device package in which the second resins 130 shown in FIGS. 11 to 14, the resins 131 and 132 shown in FIGS. 1 to 10, and recesses Ru and R12 provided with the resins 131 and 132 are comprised is also possible.

FIG. 15 shows a light emitting device package according to a seventh embodiment.

The seventh embodiment is the same as the fourth to sixth embodiments except for a fourth resin 230. Therefore, in the seventh embodiment, components having the same function, structure, or shape as those of the fourth to sixth embodiments will be designated by the same reference numerals and detailed description thereof may be omitted. A description omitted in the seventh embodiment may be easily understood from the fourth to sixth embodiments.

In describing a light emitting device package 100F according to the sixth embodiment with reference to FIG. 15, a description of contents overlapping with the contents described with reference to FIGS. 1 to 14 may be omitted.

The light emitting device package 100F according to the seventh embodiment may comprise the fourth resin 230. For example, the fourth resin 230 may be provided at an upper surface and a side surface of a light emitting device 120. In addition, the fourth resin 230 may be provided at an inclined inner surface of a cavity C of a body 110, but the embodiment is not limited thereto.

For example, the fourth resin 230 may comprise silicone and a wavelength conversion material. As the wavelength conversion material, a phosphor or a quantum dot may be used. For example, light may be converted to light of blue wavelength, light of green wavelength or light of red wavelength, depending on whether a certain phosphor or quantum dot is used. Light of a specific wavelength generated in the light emitting device 120 may be converted into light of another wavelength by the fourth resin 230 comprising the silicone and the wavelength conversion material. Therefore, the light efficiency may be improved and a high color reproducibility may be realized. For example, the fourth resin 230 may comprise the silicone and $K_2SiF_6:Mn^{4+}$ (hereinafter, KSF). KSF may be a red phosphor.

A first resin 220 may be provided on the fourth resin 230. The first resin 220 may be referred to as a moisture barrier layer.

The first resin 220 may comprise a material having excellent moisture resistance. The first resin 220 may comprise methyl-based silicone or phenyl-based silicone. After the methyl-based silicone or the phenyl-based silicone is mixed with a binder, the first resin 220 may be formed by being sprayed into the fourth resin 230 using a spray coating method and then cured. Spray coating may be performed multiple times to have a predetermined thickness to have moisture resistance properties. Accordingly, even though external moisture penetrates the body 110, it is blocked by the first resin 220 provided at an inclined side surface of the cavity C, thereby protecting the light emitting device 120 from moisture. Even though the external moisture penetrates the molding part 140, it is blocked by the first resin 220 provided at the upper and side surfaces of the light emitting device 120, thereby protecting the light emitting device 120 from moisture.

The light emitting device package 100F according to the seventh embodiment may further comprise a second resin 130. The second resin 130 may be provided at a first recess R10 formed in the body 110.

A fourth recess R13 may be formed at an upper surface of the second resin 130. A width of the fourth recess R13 may be smaller than that of the first recess R10, but the embodiment is not limited thereto. A depth of the fourth recess R13 may be smaller than that of the first recess R10, but the embodiment is not limited thereto.

A third resin 370 may be provided at the fourth recess R13. An upper surface of the third resin 370 may be in contact with a lower surface of the light emitting device 120.

Therefore, the light emitting device 120 may be fixed to the body 110 more firmly by the third resin 370 as well as the second resin 130.

The light emitting device package 100F according to the seventh embodiment may further comprise a molding part 140. The molding part 140 may comprise silicone and MGF phosphor. $MgF_2:Mn^{2+}$, $(Zn, Mg) F_2:Mn^{2+}$, and $(K, Mg) F_2:Mn^{2+}$ may be used as MGF phosphor, but the embodiment is not limited thereto.

A phosphor of the fourth resin 230 and a phosphor of the molding part 140 may be the same or different.

As described above, the first resin 220, which is a moisture barrier layer, may be disposed between the fourth resin 230 and the molding part 140.

KSF, which is a phosphor of the fourth resin 230, is weak in moisture resistance. According to the embodiment, the first resin 220 is disposed on the fourth resin 230, and thus the KSF of the fourth resin 230 may be protected from moisture. Accordingly, the phosphor of the fourth resin 230 is not affected by moisture, thereby improving a color rendering index (CRI).

FIG. 16 shows a light emitting device package according to an eighth embodiment.

The eighth embodiment is the same as the first to seventh embodiments (FIGS. 1 to 15) except that an upper surface of a body 100 is disposed lower than that of a light emitting device 120. In the eighth embodiment, components having the same function, structure, or shape as those of the first to seventh embodiments will be designated by the same reference numerals and detailed description thereof may be omitted. A description omitted in the eighth embodiment may be easily understood from the first to seventh embodiments.

In describing a light emitting device package 100G according to the eighth embodiment with reference to FIG. 16, a description of contents overlapping with the contents described with reference to FIGS. 1 to 15 may be omitted.

In the light emitting device package 100G according to the eighth embodiment, the body may comprise a first region in which the light emitting device 120 is disposed, a second region that is coplanar with an upper surface of a cavity C, an inclined side portion disposed between the first region and the second region, a first recess R10 disposed in the first region, and second and third recesses R11 and R12 disposed between the first region and the side portion. In such a case, an upper surface of the first region may be lower than an upper surface of the light emitting device based on a lower surface of the body.

The light emitting device package 100G according to the eighth embodiment may be provide with a molding part 140.

The molding part 140 may comprise silicone and MGF phosphor. $MgF_2:Mn^{2+}$, $(Zn, Mg) F_2:Mn^{2+}$, and $(K, Mg) F_2:Mn^{2+}$ may be used as MGF phosphor, but the embodiment is not limited thereto.

The molding part 140 may surround the light emitting device 120. The light emitting device 120 may be protected by the molding part 140. Light of a specific wavelength of the light emitting device 120 may be converted into light of another wavelength by the molding part 140. The light emitting device 120 may be fixed to the body 110 more firmly by the molding part 140.

FIG. 17 shows a light emitting device package according to a ninth embodiment.

The ninth embodiment is the same as the first to eighth embodiments (FIGS. 1 to 16) except for a body 100 without a cavity C. In the ninth embodiment, components having the same function, structure, or shape as those of the first to eighth embodiments will be designated by the same reference numerals and detailed description thereof may be omitted. A description omitted in the ninth embodiment may be easily understood from the first to eighth embodiments.

In describing a light emitting device package 100H according to the ninth embodiment with reference to FIG. 17, a description of contents overlapping with the contents described with reference to FIGS. 1 to 16 may be omitted.

A body 110 may have a lower surface and an upper surface parallel to each other. The body 110 may have first and second openings TH1 and TH2. First and second conductive layers 321 and 322 may be provided at the first and second openings TH1 and TH2, respectively.

In addition, an upper surface of the body 110 may have first to third recesses R10, R11, and R12. 130. First to third resins 130, 131, and 132 may be provided at each of the first to third recesses R10, R11, and R12.

An upper surface of the light emitting device 120 may be higher than the upper surface of the body 110 based on the lower surface of the body 110.

Hereinafter, the light emitting device 120 shown in FIGS. 1 to 14 will be described in detail.

FIG. 18 is a plan view showing the light emitting device according to the first embodiment, and FIG. 19 is a cross-sectional view taken along line F-F of the light emitting device shown in FIG. 18.

To help in understanding, in showing FIG. 18, only the relative arrangement relationship between a first electrode 127 and a second electrode 128 is conceptually shown. The first electrode 127 may comprise a first bonding part 121 and a first branch electrode 125. The second electrode 128 may comprise a second bonding part 122 and a second branch electrode 126.

The light emitting device 120 according to the embodiment may comprise a light emitting structure 123 on the substrate 124, as shown in FIGS. 18 and 19.

The substrate 124 may be selected from the group including a sapphire substrate ($Al_2O_3$), SiC, GaAs, GaN, ZnO, Si, GaP, InP, and Ge. For example, the substrate 124 may be provided as a patterned sapphire substrate (PSS) in which a concavo-convex pattern is formed on the upper surface.

The light emitting structure 123 may comprise a first conductivity type semiconductor layer 123a, an active layer 123b, and a second conductivity type semiconductor layer 123c. The active layer 123b may be disposed between the first conductivity type semiconductor layer 123a and the second conductivity type semiconductor layer 123c. As an example, the active layer 123b may be disposed on the first conductivity type semiconductor layer 123a, and the second conductivity type semiconductor layer 123c may be disposed on the active layer 123b.

According to the embodiment, the first conductivity type semiconductor layer 123a may be provided as an n-type semiconductor layer, and the second conductivity type semiconductor layer 123c may be provided as a p-type semiconductor layer. Of course, according to another embodiment, the first conductivity type semiconductor layer 123a may be provided as a p-type semiconductor layer, and the second conductivity type semiconductor layer 123c may be provided as an n-type semiconductor layer.

The light emitting device 120 according to the embodiment may comprise a first electrode 127 and a second electrode 128, as shown in FIGS. 18 and 19.

The first electrode 127 may comprise a first bonding part 121 and a first branch electrode 125. The first electrode 127 may be electrically connected to the second conductivity type semiconductor layer 123c. The first branch electrode 125 may be branched from the first bonding part 121. The first branch electrode 125 may comprise a plurality of branch electrodes branched from the first bonding part 121.

The second electrode 128 may comprise a second bonding part 122 and a second branch electrode 126. The second electrode 128 may be electrically connected to the first conductivity type semiconductor layer 123a. The second branch electrode 126 may be branched from the second bonding part 122. The second branch electrode 126 may comprise a plurality of branch electrodes branched from the second bonding part 122.

The first branch electrode 125 and the second branch electrode 126 may be disposed to stagger each other in a finger shape. A power supplied through the first bonding part 121 and the second bonding part 122 by the first branch electrode 125 and the second branch electrode 126 may be diffused and provided at the entire light emitting structure 123.

The first electrode 127 and the second electrode 128 may be formed as a single-layer structure or a multi-layer structure. For example, the first electrode 127 and the second electrode 128 may be an ohmic electrode. For example, the first electrode 127 and the second electrode 128 may be formed of at least one material of ZnO, IrOx, RuOx, NiO, RuOx/ITO, Ni/IrOx/Au, and Ni/IrOx/Au/ITO, Ag, Ni, Cr, Ti, Al, Rh, Pd, Ir, Ru, Mg, Zn, Pt, Au, and Hf, or an alloy of two or more thereof.

Meanwhile, a protective layer may be further provided at the light emitting structure 123. The protective layer may be provided at the upper surface of the light emitting structure 123. In addition, the protective layer may be provided at the side surface of the light emitting structure 123. The protective layer may be provided so that the first bonding part 121 and the second bonding part 122 are exposed. In addition, the protective layer may be selectively provided at the periphery and the lower surface of the substrate 124.

As an example, the protective layer may be provided as an insulating material. For example, the protective layer may be formed of at least one material selected from the group including $Si_xO_y$, $SiO_xN_y$, $Si_xN_y$, and $Al_xO_y$.

In the light emitting device according to the embodiment, light generated in the active layer 123b may be emitted in six surface directions of the light emitting device. The light generated in the active layer 123b may be emitted in six surface directions through an upper surface, a low surface, and four side surfaces of the light emitting device.

FIG. 20 shows a light emitting device according to the second embodiment.

The second embodiment (FIG. 20) is the same as the first embodiment (FIGS. 18 and 19) except for a resin layer 610. In the second embodiment (FIG. 20), components having the same function, structure, or shape as those of the first embodiment (FIGS. 18 and 19) will be designated by the same reference numerals and detailed description thereof may be omitted. A description omitted in the second embodiment may be easily understood from the first embodiment.

Referring to FIG. 20, the light emitting device 120 according to the second embodiment may comprise the resin layer 610. The resin layer 610 may be provided at an upper surface and a side surface of a light emitting device 120.

A thickness of the resin layer 610 corresponding to the upper surface of the light emitting device 120 may be the same as a thickness of the resin layer 610 corresponding to the side surface of the light emitting device 120, but the embodiment is not limited thereto.

The resin layer 610 may comprise methyl-based silicone or phenyl-based silicone.

According to the embodiment, the resin layer 610 may be adjusted so that light of the light emitting device 120 is uniformly emitted.

According to the embodiment, the resin layer 610 may protect the light emitting device 120 from moisture by preventing moisture from permeating.

FIG. 21 shows a light emitting device according to the third embodiment.

Referring to FIG. 21, the light emitting device 120 according to the third embodiment may comprise a second resin layer 620.

The second resin layer 620 may be provided on the first resin layer 610. As an example, the second resin layer 620 may be disposed on an upper surface of the first resin layer 610, but the embodiment is not limited thereto. That is, the second resin layer 620 may be disposed on a side surface as well as the upper surface of the first resin layer 610.

A third resin layer 640 may be provided between the second resin layer 620 and the first resin layer 610.

The third resin layer 640 may be referred to as an adhesive layer. The second resin layer 620 may be attached to the first resin layer 610 by the third resin layer 640.

The first resin layer 610, the second resin layer 620, and the third resin layer 640 may comprise silicone. The silicone may comprise methyl-based silicone or phenyl-based silicone.

The first resin layer 610 may comprise silicone and a wavelength conversion material. A phosphor or a quantum dot may be used as the wavelength conversion material.

The second resin layer 620 may comprise silicone and scattering particles. Scattering particles may comprise, for example, $TiO_2$, $SiO_2$, etc., but the embodiment is not limited thereto.

The third resin layer 640 may comprise silicone and an adhesive. The third resin layer 640 may have a function as the adhesive by a thermal process and a curing process without the adhesive.

According to the embodiment, an optimal light extraction effect may be obtained by adjusting a material and a refractive index of each of the first resin layer 610 and the second resin layer 620.

As a first example, the first resin layer 610 may comprise phenyl-based silicone and have a refractive index of at least 1.5 or more. The second resin layer 620 may comprise methyl-based silicone and have a refractive index of 1.4 to 1.5.

As a second example, the first resin layer 610 may comprise methyl-based silicone and have a refractive index of 1.4 to 1.5. The second resin layer 620 may comprise phenyl-based silicone and have a refractive index of at least 1.5 or more.

As a third example, the first resin layer 610 and the second resin layer 620 may comprise methyl-based silicone and have a refractive index of 1.4 to 1.5.

As a fourth example, the first resin layer 610 and the second resin layer 620 may comprise phenyl-based silicone and have a refractive index of at least 1.5 or more.

FIG. 22 shows a light emitting device according to the fourth embodiment.

The fourth embodiment is the same as the third embodiment (FIG. 21) except that a pattern 630 is formed on the second resin layer 620. In the fourth embodiment, components having the same function, structure, or shape as those of the third embodiment will be designated by the same reference numerals and detailed description thereof may be omitted. A description omitted in the fourth embodiment may be easily understood from the third embodiment.

Referring to FIG. 22, the light emitting device 120 according to the fourth embodiment may comprise the second resin layer 620.

A plurality of patterns 630 may be provided on at least one surface of the second resin layer 620. For example, the plurality of patterns 630 may be disposed on an upper surface of the second resin layer 620. The pattern 630 may be a concavo-convex pattern. The pattern 630 may comprise a plurality of protrusions.

The pattern 630 may have an embossing shape when viewed from an upper direction of the light emitting device 120. The pattern 630 may have a convex round shape upward from the upper surface of the second resin layer 620.

Heights of upper peak points of the pattern 630 may be provided identically to each other. In addition, the heights of the upper peak points of the pattern 630 may be provided differently from each other.

The pattern 630 may comprise a recess having a concave round shape downward from the upper surface of the second resin layer 620.

Meanwhile, the light emitting device package according to the embodiment described above has been described based on a case in which the first bonding part and the second bonding part are in direct contact with the first and second conductive layers.

However, according to still another example of the light emitting device package of the embodiment, another conductive component may be further disposed between the first bonding part and the second bonding part, and the first and second conductive layers.

Meanwhile, the light emitting device package according to the embodiment described with reference to FIGS. 1 to 23 may be applied to a light source device.

In addition, the light source device may comprise a display device, a lighting device, a head lamp, and the like according to an industrial field.

As an example of the light source device, the display device may comprise a bottom cover, a reflector disposed on the bottom cover, a light emitting module that emits light and comprises a light emitting device, a light guide plate disposed in front of the reflector and guiding light emitted from the light emitting module forward, an optical sheet comprising prism sheets disposed in front of the light guide plate, a display panel disposed in front of the optical sheet, an image signal output circuit connected to the display panel and supplying an image signal to the display panel, and a color filter disposed in front of the display panel. Here, the bottom cover, the reflector, the light emitting module, the light guide plate, and the optical sheet may form a backlight unit. In addition, the display device may have a structure in which a light emitting device that emits red, green, and blue light is disposed respectively without comprising the color filter.

As still another example of the light source device, the head lamp may comprise a light emitting module comprising a light emitting device package disposed on a substrate, a reflector that reflects light emitted from the light emitting module in a predetermined direction, for example, forward, a lens that refracts light reflected by the reflector forward, and a shade that blocks or reflects a portion of light reflected by the reflector toward the lens so as to form a light distribution pattern desired by a designer.

The lighting device which is another example of the light source device may comprise a cover, a light source module, a radiator, a power supply, an inner case, and a socket. Further, the light source device according to the embodiment may further comprise any one or more of a member and a holder. The light source module may comprise the light emitting device package according to the embodiment.

Meanwhile, the light emitting device package according to the embodiment described above may comprise various modified examples.

Hereinafter, the modified examples of the light emitting device package according to the embodiment will be described with reference to the drawings, and each modified example may be applied to the embodiment of the light emitting device package described with reference to FIGS. 1 to 17. In addition, each of the modified examples described below may be applied in combination with a plurality of modified examples within a scope that does not collide with each other.

First, a light emitting device package according to a tenth embodiment will be described with reference to FIG. 23. In describing the light emitting device package according to the embodiment with reference to FIG. 23, a description of contents overlapping with the contents described above may be omitted.

The light emitting device package according to the tenth embodiment may not comprise a recess provided in a body 110 as compared with the embodiment described with reference to FIGS. 1 to 10. According to the embodiment, as shown in FIG. 23, the recess may not be provided at an upper surface of the body 110.

An upper surface of the first body 113 disposed between the first opening TH1 and the second opening TH2 may be provided as a flat surface. The upper surface of the first body 113 and a lower surface of the light emitting device 120 may be disposed in parallel with each other. A first resin 130 may be provided between the upper surface of the first body 113 and the light emitting device 120.

In addition, as shown in FIG. 23, a second resin 131 and a third resin 132 may be disposed between the light emitting device 120 and the first body 113. The second resin 131 may be disposed at a side surface of a first bonding part 121, and the third resin 132 may be disposed at a side surface of a second bonding part 122. The second resin 131 may be disposed between the first bonding part 121 and the second body 117. The third resin 132 may be disposed between the second bonding part 122 and the second body 117.

The first body 113 and the light emitting device 120 may be stably fixed by the first resin 130, the second resin 131, and the third resin 132. In addition, circumferences of the first and second bonding parts 121 and 122 may be sealed by the first resin 130, the second resin 131, and the third resin 132.

According to the embodiment, the first resin 130, the second resin 131, and the third resin 132 may comprise the same material. In addition, at least one of the first resin 130, the second resin 131, and the third resin 132 may comprise a different material.

According to the embodiment, a size of the first and second bonding parts 121 and 122 may be provided larger than that of the first and second openings TH1 and TH2. For example, the size of the first and second openings TH1 and TH2 may be provided in an area of 50% to 99% of the size of the first and second bonding parts 121 and 122. In addition, the size of the first and second openings TH1 and TH2 may be provided in an area of 70% to 90% of the size of the first and second bonding parts 121 and 122.

Next, a light emitting device package according to an eleventh embodiment will be described with reference to FIG. 24. In describing the light emitting device package according to the embodiment with reference to FIG. 24, a description of contents overlapping with the contents described above may be omitted.

In the light emitting device package according to the eleventh embodiment, an upper surface of a body 110 may be provided as a flat surface as compared with the embodiment described with reference to FIGS. 1 to 10. The light emitting device package according to the embodiment may not comprise a cavity.

In addition, the light emitting device package according to the eleventh embodiment may not comprise a recess provided in the body 110 as compared with the embodiment described with reference to FIGS. 1 to 10. According to the embodiment, as shown in FIG. 24, the recess may not be provided at the upper surface of the body 110.

The upper surface of the body 110 disposed between the first opening TH1 and the second opening TH2 may be provided as a flat surface. The upper surface of the body 110 and a lower surface of the light emitting device 120 may be disposed in parallel with each other. A first resin 130 may be provided between the upper surface of the body 110 and the light emitting device 120.

In addition, as shown in FIG. 24, a molding part 140 may be disposed at a circumference of the light emitting device 120. A part of a lower surface of the molding part 140 may be in direct contact with the upper surface of the body 110. As the lower surface of the molding part 140 and the upper surface of the body 110 are in direct contact, adhesion between the molding part 140 and the body 110 may be improved.

A side surface of the molding part 140 and a side surface of the body 110 may be disposed on the same vertical surface. The side surface of the molding part 140 and the side surface of the body 110 may provide the same plane.

A second resin 131 may be provided between the first bonding part 121 and the molding part 140 under the lower surface of the light emitting device 120. In addition, a third resin 132 may be provided between the second bonding part 122 and the molding part 140 under the lower surface of the light emitting device 120.

The light emitting device 120 and the body 110 may be stably fixed by the first resin 130, the second resin 131, the third resin 132, and the molding part 140. In addition, circumferences of the first and first bonding parts 121 and 122 may be sealed by the first resin 130, the second resin 131, and the third resin 132.

According to the embodiment, the first resin 130, the second resin 131, and the third resin 132 may comprise the same material. In addition, at least one of the first resin 130, the second resin 131, and the third resin 132 may comprise a different material.

According to the embodiment, a size of the first and second bonding parts 121 and 122 may be provided larger than that of the first and second openings TH1 and TH2. For example, the size of the first and second openings TH1 and TH2 may be provided in an area of 50% to 99% of the size of the first and second bonding parts 121 and 122. In addition, the size of the first and second openings TH1 and TH2 may be provided in an area of 70% to 90% of the size of the first and second bonding parts 121 and 122.

Next, a light emitting device package according to a twelfth embodiment will be described with reference to FIG. 25. In describing the light emitting device package according to the embodiment with reference to FIG. 25, a description of contents overlapping with the contents described above may be omitted.

According to the embodiment, a side surface of the molding part 140, a side surface of the third resin 132, and an upper surface of a body 110 may be provided the same plane.

An end of the third resin 132 may be exposed at an outer surface of the molding part 140. In addition, the end of the third resin 132 may comprise a side surface having a curvature.

Next, a light emitting device package according to a thirteenth embodiment will be described with reference to FIG. 26. In describing the light emitting device package according to the embodiment with reference to FIG. 26, a description of contents overlapping with the contents described above may be omitted.

In the light emitting device package according to the thirteenth embodiment, an upper surface of a body 110 may be provided as a flat surface as compared with the embodiment described with reference to FIGS. 1 to 10. The light emitting device package according to the embodiment may not comprise a cavity.

In addition, the light emitting device package according to the thirteenth embodiment may not comprise a recess provided in the body 110 as compared with the embodiment described with reference to FIGS. 1 to 10. According to the embodiment, as shown in FIG. 26, the recess may not be provided at the upper surface of the body 110.

The upper surface of the body 110 disposed between the first opening TH1 and the second opening TH2 may be provided as a flat surface. The upper surface of the body 110 and a lower surface of the light emitting device 120 may be disposed in parallel with each other. A first resin 130 may be provided between the upper surface of the body 110 and the light emitting device 120.

In addition, as shown in FIG. 26, a clear molding part 510 may be provided at a circumference of the light emitting device 120. The clear molding part 510 may be disposed at the circumference of the light emitting device 120 to improve a sealing effect and to prevent moisture or foreign matter from penetrating into a region in which the light emitting device 120 is disposed.

According to the embodiment, the molding part 140 may be disposed at a circumference of the clear molding part 510. A second resin 131 and a third resin 132 may be disposed between the light emitting device 120 and the body 110. The second resin 131 may be disposed at a side surface of a first bonding part 121, and the third resin 132 may be disposed at a side surface of a second bonding part 122.

A part of a lower surface of the molding part 140 may be disposed in direct contact with an upper surface of the second resin 131. A part of the lower surface of the molding part 140 may be disposed in direct contact with an upper surface of the third resin 132.

The body 110 and the light emitting device 120 may be stably fixed by the first resin 130, the second resin 131, and the third resin 132. In addition, circumferences of the first and second bonding parts 121 and 122 may be sealed by the first resin 130, the second resin 131, and the third resin 132.

A side surface of the molding part 140, a side surface of the second resin 131, and a side surface of the body 110 may be disposed on the same vertical surface. The side surface of the molding part 140, the side surface of the second resin 131, and the side surface of the body 110 may provide the same plane.

In addition, the side surface of the molding part 140, a side surface of the third resin 132, the side surface of the body 110 may be disposed on the same vertical surface. The side surface of the molding part 140, the side surface of the third resin 132, and the side surface of the body 110 may provide the same plane.

According to the embodiment, the first resin 130, the second resin 131, and the third resin 132 may comprise the same material. In addition, at least one of the first resin 130, the second resin 131, and the third resin 132 may comprise a different material.

According to the embodiment, a size of the first and second bonding parts 121 and 122 may be provided larger than that of the first and second openings TH1 and TH2. For example, the size of the first and second openings TH1 and TH2 may be provided in an area of 50% to 99% of the size of the first and second bonding parts 121 and 122. In addition, the size of the first and second openings TH1 and TH2 may be provided in an area of 70% to 90% of the size of the first and second bonding parts 121 and 122.

In addition, according to the light emitting device package according to the embodiment, the second and third resins 131 and 132 may be formed of a material having high reflectivity, and light provided from the light emitting device 120 may be efficiently reflected and extracted upward. Accordingly, according to the light emitting device package according to the embodiment, light extraction efficiency may be improved, and thus luminous intensity Po may be increased.

Next, a light emitting device package according to a fourteenth embodiment will be described with reference to FIG. 27. In describing the light emitting device package according to the embodiment with reference to FIG. 27, a description of contents overlapping with the contents described above may be omitted.

The embodiment shown in FIG. 27 differs from the embodiment described with reference to FIG. 26 in that a phosphor thin film 710 is applied instead of the clear molding part 510.

According to the embodiment, the phosphor thin film 710 may be provided at a circumference of the light emitting device 120. The phosphor thin film 710 may be disposed at the circumference of the light emitting device 120 to improve light conversion efficiency of light provided from the light emitting device 120.

The molding part 140 may be provided as a clear molding part that does not comprise a light conversion material. In addition, the molding part 140 may comprise a light conversion material. For example, the molding part 140 may comprise a light conversion material that provides light having a wavelength band different from that of a light conversion material comprised in the phosphor thin film 710.

Next, a light emitting device package according to a fifteenth embodiment will be described with reference to FIG. 28. In describing the light emitting device package according to the embodiment with reference to FIG. 28, a description of contents overlapping with the contents described above may be omitted.

The light emitting device package according to the fifteenth embodiment may not comprise a recess provided in a body 110 as compared with the embodiment described with reference to FIGS. 11 to 14. According to the embodiment, as shown in FIG. 28, the recess may not be provided at an upper surface of the body 110.

An upper surface of the first body 113 disposed between the first opening TH1 and the second opening TH2 may be provided as a flat surface. The upper surface of the first body 113 and a lower surface of the light emitting device 120 may be disposed in parallel with each other. A second resin 130 may be provided between the upper surface of the first body 113 and the light emitting device 120.

For example, the second resin 130 may comprise an insulating material. Specifically, the second resin 130 may comprise at least one of an epoxy-based material, a silicone-based material, and a hybrid material comprising an epoxy-based material and a silicone-based material. In addition, the second resin 130 may reflect light emitted from the light emitting device 120.

In addition, as shown in FIG. 28, the light emitting device package according the embodiment may comprise a first resin 220. The first resin 220 may be referred to as a moisture barrier layer.

The first resin 220 may comprise a material having excellent moisture resistance. The first resin 220 may comprise methyl-based silicone or phenyl-based silicone. After the methyl-based silicone or the phenyl-based silicone is mixed with a binder, the first resin 220 may be formed by being sprayed into a cavity C of the body 110 using a spray coating method and then cured. Spray coating may be performed multiple times to have a predetermined thickness to have moisture resistance properties.

The first resin 220 may be provided, for example, at an upper surface and a side surface of the light emitting device 120. The first resin 220 may be provided at an inclined inner surface of the cavity C of the body 110. Accordingly, even though external moisture penetrates the body 110, it is blocked by the first resin 220 provided at an inclined side surface of the cavity C, thereby protecting the light emitting device 120 from moisture. Even though the external moisture penetrates the molding part 140, it is blocked by the first resin 220 provided at the upper and side surfaces of the light emitting device 120, thereby protecting the light emitting device 120 from moisture.

Next, a light emitting device package according to a sixteenth embodiment will be described with reference to FIG. 29. In describing the light emitting device package according to the embodiment with reference to FIG. 29, a description of contents overlapping with the contents described above may be omitted.

In the light emitting device package according to the sixteenth embodiment, an upper surface of a body 110 may be provided as a flat surface as compared with the embodiment described with reference to FIGS. 11 to 14. The light emitting device package according to the embodiment may not comprise a cavity.

In addition, the light emitting device package according to the sixteenth embodiment may not comprise a recess provided in the body 110 as compared with the embodiment described with reference to FIGS. 11 to 14. According to the embodiment, as shown in FIG. 29, the recess may not be provided at the upper surface of the body 110.

The upper surface of the body 110 disposed between the first opening TH1 and the second opening TH2 may be provided as a flat surface. The upper surface of the body 110 and a lower surface of the light emitting device 120 may be disposed in parallel with each other. A second resin 130 may be provided between the upper surface of the body 110 and the light emitting device 120.

In addition, as shown in FIG. 29, the light emitting device package according the embodiment may comprise a first resin 220. The first resin 220 may be referred to as a moisture barrier layer. The first resin 220 may comprise a material having excellent moisture resistance. The first resin 220 may comprise methyl-based silicone or phenyl-based silicone.

The first resin 220 may be provided, for example, at an upper surface and a side surface of the light emitting device 120. The first resin 220 may also be provided in direct contact with the upper surface of the body 110. Accordingly, even though external moisture penetrates the molding part 140, it is blocked by the first resin 220 provided at the upper and side surfaces of the light emitting device 120, thereby protecting the light emitting device 120 from moisture.

In addition, a side surface of the molding part 140, a side surface of the first resin 220, and a side surface of the body 110 may be disposed on the same vertical surface. The side surface of the molding part 140, the side surface of the first resin 220, and the side surface of the body 110 may provide the same plane.

In addition, according to the light emitting device package according to the embodiment, the first resin 220 may be formed of a material having high reflectivity, and light provided from the light emitting device 120 may be efficiently reflected and extracted upward. Accordingly, according to the light emitting device package according to the embodiment, light extraction efficiency may be improved, and thus luminous intensity Po may be increased.

Next, a light emitting device package according to a seventeenth embodiment will be described with reference to FIG. 30. In describing the light emitting device package according to the embodiment with reference to FIG. 30, a description of contents overlapping with the contents described above may be omitted.

In the light emitting device package according to the seventeenth embodiment, an upper surface of a body 110 may be provided as a flat surface as compared with the embodiment described with reference to FIGS. 11 to 14. The light emitting device package according to the embodiment may not comprise a cavity.

In addition, the light emitting device package according to the seventeenth embodiment may not comprise a recess provided in the body 110 as compared with the embodiment described with reference to FIGS. 11 to 14. According to the embodiment, as shown in FIG. 30, the recess may not be provided at the upper surface of the body 110.

The upper surface of the body 110 disposed between the first opening TH1 and the second opening TH2 may be provided as a flat surface. The upper surface of the body 110 and a lower surface of the light emitting device 120 may be disposed in parallel with each other. A second resin 130 may be provided between the upper surface of the body 110 and the light emitting device 120.

In addition, as shown in FIG. 30, the light emitting device package according the embodiment may comprise a first resin 220. The first resin 220 may be referred to as a moisture barrier layer. The first resin 220 may comprise a material having excellent moisture resistance. The first resin 220 may comprise methyl-based silicone or phenyl-based silicone.

The first resin 220 may be provided, for example, at an upper surface and a side surface of the light emitting device 120. The first resin 220 may also be provided in direct contact with the upper surface of the body 110. Accordingly, even though external moisture penetrates the molding part 140, it is blocked by the first resin 220 provided at the upper and side surfaces of the light emitting device 120, thereby protecting the light emitting device 120 from moisture.

In addition, as shown in FIG. 30, a molding part 140 may be disposed at a circumference of the light emitting device 120. The molding part 140 may be provided at the upper and side surfaces of the first resin 220. In addition, a part of a lower surface of the molding part 140 may be disposed in direct contact with the upper surface of the body 110.

A side surface of the molding part 140 and a side surface of the body 110 may be disposed on the same vertical surface. The side surface of the molding part 140 and the side surface of the body 110 may provide the same plane.

Next, a light emitting device package according to an eighteenth embodiment will be described with reference to FIG. 31. In describing the light emitting device package according to the embodiment with reference to FIG. 31, a description of contents overlapping with the contents described above may be omitted.

The light emitting device package according to the eighteenth embodiment may not comprise a recess provided in a body 110 as compared with the embodiment described with reference to FIG. 15. According to the embodiment, as shown in FIG. 31, the recess may not be provided at an upper surface of the body 110.

An upper surface of the first body 113 disposed between the first opening TH1 and the second opening TH2 may be provided as a flat surface. The upper surface of the first body 113 and a lower surface of the light emitting device 120 may be disposed in parallel with each other. A second resin 130 may be provided between the upper surface of the first body 113 and the light emitting device 120.

For example, the second resin 130 may comprise an insulating material. Specifically, the second resin 130 may comprise at least one of an epoxy-based material, a silicone-based material, and a hybrid material comprising an epoxy-based material and a silicone-based material. In addition, the second resin 130 may reflect light emitted from the light emitting device 120.

In addition, as shown in FIG. 31, the light emitting device package according the embodiment may comprise a fourth resin 230. For example, the fourth resin 230 may be provided at upper and side surfaces of the light emitting device 120. In addition, the fourth resin 230 may be provided at an inclined inner surface of a cavity C of the body 110, but the embodiment is not limited thereto.

For example, the fourth resin 230 may comprise silicone and a wavelength conversion material. As the wavelength conversion material, a phosphor or a quantum dot may be used. For example, light may be converted to light of blue wavelength, light of green wavelength or light of red wavelength, depending on whether a certain phosphor or quantum dot is used. Light of a specific wavelength generated in the light emitting device 120 may be converted into light of another wavelength by the fourth resin 230 comprising the silicone and the wavelength conversion material. Therefore, the light efficiency may be improved and a high color reproducibility may be realized. For example, the fourth resin 230 may comprise the silicone and K2SiF6:Mn4+ (hereinafter, KSF). KSF may be a red phosphor.

A first resin 220 may be provided on the fourth resin 230. The first resin 220 may be referred to as a moisture barrier layer. The first resin 220 may comprise a material having excellent moisture resistance. The first resin 220 may comprise methyl-based silicone or phenyl-based silicone.

The first resin 220 may be provided at the upper and side surfaces of the light emitting device 120. The first resin 220 may be provided at an inclined inner surface of a cavity C of the body 110. Accordingly, even though external moisture penetrates the body 110, it is blocked by the first resin 220 provided at an inclined side surface of the cavity C, thereby protecting the light emitting device 120 from moisture. Even though the external moisture penetrates the molding part 140, it is blocked by the first resin 220 provided at the upper and side surfaces of the light emitting device 120, thereby protecting the light emitting device 120 from moisture.

Next, a light emitting device package according to a nineteenth embodiment will be described with reference to FIG. 32. In describing the light emitting device package according to the embodiment with reference to FIG. 32, a description of contents overlapping with the contents described above may be omitted.

In the light emitting device package according to the nineteenth embodiment, an upper surface of a body 110 may be provided as a flat surface as compared with the embodiment described with reference to FIG. 15. The light emitting device package according to the embodiment may not comprise a cavity.

In addition, the light emitting device package according to the nineteenth embodiment may not comprise a recess provided in the body 110 as compared with the embodiment described with reference to FIG. 15. According to the embodiment, as shown in FIG. 32, the recess may not be provided at the upper surface of the body 110.

The upper surface of the body 110 disposed between the first opening TH1 and the second opening TH2 may be provided as a flat surface. The upper surface of the body 110 and a lower surface of the light emitting device 120 may be disposed in parallel with each other. A second resin 130 may be provided between the upper surface of the body 110 and the light emitting device 120.

For example, the second resin 130 may comprise an insulating material. Specifically, the second resin 130 may comprise at least one of an epoxy-based material, a silicone-based material, and a hybrid material comprising an epoxy-based material and a silicone-based material. In addition, the second resin 130 may reflect light emitted from the light emitting device 120.

In addition, as shown in FIG. 32, the light emitting device package according the embodiment may comprise a fourth resin 230. For example, the fourth resin 230 may be provided at upper and side surfaces of the light emitting device 120. In addition, the fourth resin 230 may be provided in direct contact with the upper surface of the body 110.

For example, the fourth resin 230 may comprise silicone and a wavelength conversion material. As the wavelength conversion material, a phosphor or a quantum dot may be used. For example, light may be converted to light of blue wavelength, light of green wavelength or light of red wavelength, depending on whether a certain phosphor or quantum dot is used. Light of a specific wavelength generated in the light emitting device 120 may be converted into light of another wavelength by the fourth resin 230 comprising the silicone and the wavelength conversion material. Therefore, the light efficiency may be improved and a high color reproducibility may be realized. For example, the fourth resin 230 may comprise the silicone and K2SiF6:Mn4+ (hereinafter, KSF). KSF may be a red phosphor.

A first resin 220 may be provided on the fourth resin 230. The first resin 220 may be referred to as a moisture barrier layer. The first resin 220 may comprise a material having excellent moisture resistance. The first resin 220 may comprise methyl-based silicone or phenyl-based silicone.

The first resin 220 may be provided at the upper and side surfaces of the light emitting device 120. Accordingly, even though external moisture penetrates the molding part 140, it is blocked by the first resin 220 provided at the upper and side surfaces of the light emitting device 120, thereby protecting the light emitting device 120 from moisture.

In addition, a side surface of the molding part 140, a side surface of the first resin 220, a side surface of the fourth resin 230, and a side surface of the body 110 may be disposed on the same vertical surface. The side surface of the molding part 140, the side surface of the first resin 220, the side surface of the fourth resin 230, and the side surface of the body 110 may provide the same plane.

In addition, according to the light emitting device package according to the embodiment, the first resin 220 may be formed of a material having high reflectivity, and light provided from the light emitting device 120 may be efficiently reflected and extracted upward. Accordingly, according to the light emitting device package according to the embodiment, light extraction efficiency may be improved, and thus luminous intensity Po may be increased.

Next, a light emitting device package according to a twentieth embodiment will be described with reference to FIG. 33. In describing the light emitting device package according to the embodiment with reference to FIG. 33, a description of contents overlapping with the contents described above may be omitted.

In the light emitting device package according to the twentieth embodiment, an upper surface of a body 110 may be provided as a flat surface as compared with the embodiment described with reference to FIG. 15. The light emitting device package according to the embodiment may not comprise a cavity.

In addition, the light emitting device package according to the twentieth embodiment may not comprise a recess provided in the body 110 as compared with the embodiment described with reference to FIG. 15. According to the embodiment, as shown in FIG. 35, the recess may not be provided at the upper surface of the body 110.

The upper surface of the body 110 disposed between the first opening TH1 and the second opening TH2 may be provided as a flat surface. The upper surface of the body 110 and a lower surface of the light emitting device 120 may be disposed in parallel with each other. A second resin 130 may be provided between the upper surface of the body 110 and the light emitting device 120.

For example, the second resin 130 may comprise an insulating material. Specifically, the second resin 130 may comprise at least one of an epoxy-based material, a silicone-based material, and a hybrid material comprising an epoxy-based material and a silicone-based material. In addition, the second resin 130 may reflect light emitted from the light emitting device 120.

In addition, as shown in FIG. 33, the light emitting device package according the embodiment may comprise a fourth resin 230. For example, the fourth resin 230 may be provided at upper and side surfaces of the light emitting device 120. In addition, the fourth resin 230 may be provided in direct contact with the upper surface of the body 110.

For example, the fourth resin 230 may comprise silicone and a wavelength conversion material. As the wavelength conversion material, a phosphor or a quantum dot may be used. For example, light may be converted to light of blue wavelength, light of green wavelength or light of red wavelength, depending on whether a certain phosphor or quantum dot is used. Light of a specific wavelength generated in the light emitting device 120 may be converted into light of another wavelength by the fourth resin 230 comprising the silicone and the wavelength conversion material. Therefore, the light efficiency may be improved and a high color reproducibility may be realized. For example, the fourth resin 230 may comprise the silicone and K2SiF6:Mn4+ (hereinafter, KSF). KSF may be a red phosphor.

A first resin 220 may be provided on the fourth resin 230. The first resin 220 may be referred to as a moisture barrier layer. The first resin 220 may comprise a material having excellent moisture resistance. The first resin 220 may comprise methyl-based silicone or phenyl-based silicone.

The first resin 220 may be provided at the upper and side surfaces of the light emitting device 120. Accordingly, even though external moisture penetrates the molding part 140, it is blocked by the first resin 220 provided at the upper and side surfaces of the light emitting device 120, thereby protecting the light emitting device 120 from moisture.

In addition, as shown in FIG. 33, a molding part 140 may be disposed at a circumference of the light emitting device 120. The molding part 140 may be provided at the upper and side surfaces of the first resin 220. In addition, a part of a lower surface of the molding part 140 may be disposed in direct contact with the upper surface of the body 110.

A side surface of the molding part 140 and a side surface of the body 110 may be disposed on the same vertical surface. The side surface of the molding part 140 and the side surface of the body 110 may provide the same plane.

Next, a light emitting device package according to a twenty first embodiment will be described with reference to FIG. 34. In describing the light emitting device package according to the embodiment with reference to FIG. 34, a description of contents overlapping with the contents described above may be omitted.

The light emitting device package according to the twenty first embodiment may not comprise a recess provided in a body 110 as compared with the embodiment described with reference to FIG. 16. According to the embodiment, as shown in FIG. 34, the recess may not be provided at an upper surface of the body 110.

An upper surface of the first body 113 disposed between the first opening TH1 and the second opening TH2 may be provided as a flat surface. The upper surface of the first body 113 and a lower surface of the light emitting device 120 may be disposed in parallel with each other. A first resin 130 may be provided between the upper surface of the first body 113 and the light emitting device 120.

According to the embodiment, the upper surface of the body 110 may be disposed lower than an upper surface of the light emitting device 120. In addition, as shown in FIG. 34, a molding part 140 may be disposed at a circumference of the light emitting device 120. A part of a lower surface of the molding part 140 may be in direct contact with the upper surface of the body 110. As the lower surface of the molding part 140 and the upper surface of the body 110 are in direct contact, adhesion between the molding part 140 and the body 110 may be improved.

A side surface of the molding part 140 and a side surface of the body 110 may be disposed on the same vertical surface. The side surface of the molding part 140 and the side surface of the body 110 may provide the same plane.

Next, a light emitting device package according to a twenty second embodiment will be described with reference to FIG. 35. In describing the light emitting device package according to the embodiment with reference to FIG. 35, a description of contents overlapping with the contents described above may be omitted.

In the light emitting device package according to the twenty second embodiment, an upper surface of a body 110 may be provided as a flat surface as compared with the embodiment described with reference to FIG. 16. The light emitting device package according to the embodiment may not comprise a cavity.

In addition, the light emitting device package according to the twenty second embodiment may not comprise a recess provided in the body 110 as compared with the embodiment described with reference to FIG. 16. According to the embodiment, as shown in FIG. 35, the recess may not be provided at the upper surface of the body 110.

The upper surface of the body 110 disposed between the first opening TH1 and the second opening TH2 may be provided as a flat surface. The upper surface of the body 110 and a lower surface of the light emitting device 120 may be disposed in parallel with each other. A first resin 130 may be provided between the upper surface of the body 110 and the light emitting device 120.

In addition, as shown in FIG. 35, a molding part 140 may be disposed at a circumference of the light emitting device 120. A part of a lower surface of the molding part 140 may be in direct contact with the upper surface of the body 110. As the lower surface of the molding part 140 and the upper surface of the body 110 are in direct contact, adhesion between the molding part 140 and the body 110 may be improved.

A side surface of the molding part 140 and a side surface of the body 110 may be disposed on the same vertical surface. The side surface of the molding part 140 and the side surface of the body 110 may provide the same plane.

Next, a light emitting device package according to a twenty third embodiment will be described with reference to FIG. 36. In describing the light emitting device package according to the embodiment with reference to FIG. 36, a description of contents overlapping with the contents described above may be omitted.

The light emitting device package according to the twenty third embodiment may not comprise a recess provided in a body 110 as compared with the embodiment described with reference to FIG. 17. According to the embodiment, as shown in FIG. 36, the recess may not be provided at an upper surface of the body 110.

The upper surface of the body 110 disposed between the first opening TH1 and the second opening TH2 may be provided as a flat surface. The upper surface of the body 110 and a lower surface of the light emitting device 120 may be disposed in parallel with each other. A first resin 130 may be provided between the upper surface of the body 110 and the light emitting device 120.

In addition, as shown in FIG. 36, a molding part 140 may be disposed at a circumference of the light emitting device 120. A part of a lower surface of the molding part 140 may be in direct contact with the upper surface of the body 110. As the lower surface of the molding part 140 and the upper surface of the body 110 are in direct contact, adhesion between the molding part 140 and the body 110 may be improved.

In addition, an upper surface of the molding part 140 may be provided as a curved surface. For example, the upper surface of the molding part 140 may be provided as a spherical surface, and may also be provided as an aspherical surface. As the upper surface of the molding part 140 is provided as the curved surface, a directional angle of light extracted while the light provided from the light emitting device 120 is transmitted through the molding part 140 may be adjusted.

The molding part 140 may be disposed on a part of the upper surface of the body 110, or may be disposed on the entire region of the upper surface of the body 110.

Meanwhile, the clear molding part 510 described with reference to FIG. 26, the phosphor thin film 710 described with reference to FIG. 27, and the first resin 220 which is the moisture barrier layer described with reference to FIGS. 28 to 33, the fourth resin 230 described with reference to FIGS. 31 to 33, and the like are not specifically illustrated and described, but may be additionally applied to the semiconductor device package according to the embodiment described above.

In addition, the light emitting device package according to the embodiment described above may comprise a body 110 provided with the first opening TH1 and the second opening TH2, as shown in FIG. 37. An upper surface of the body 110 may be provided flat, for example, over the entire area. The first and second openings TH1 and TH2 may be provided passing through in a first direction from the upper surface of the body 110 toward a lower surface thereof.

The first and second openings TH1 and TH2 may be provided, for example, in a quadrangular shape at the upper surface of the body 110. In addition, the first and second openings TH1 and TH2 may be provided in a quadrangular shape at the lower surface of the body 110.

In addition, according to another embodiment, the first and second openings TH1 and TH2 may be provided in a circular shape at the upper and lower surfaces of the body 110. In addition, the first opening TH1 may be provided as a plurality of openings, and the second opening TH2 may be provided as a plurality of openings.

The characteristics, structures and effects described in the embodiments above are comprised in at least one embodiment, but are not limited to one embodiment. Furthermore, the characteristic, structure, and effect illustrated in each embodiment may be combined or modified for other embodiments by a person skilled in the art. Thus, it should be construed that contents related to such a combination and such a modification are comprised in the scope of the embodiment.

The above description has been focused on the embodiment, but it is merely illustrative and does not limit the embodiment. A person skilled in the art to which the embodiment pertains may appreciate that various modifications and applications not illustrated above are possible without departing from the essential features of the embodiment. For example, each component particularly represented in the embodiment may be modified and implemented. In addition, it should be construed that differences related to such changes and applications are comprised in the scope of the present invention defined in the appended claims.

INDUSTRIAL APPLICABILITY

According to a light emitting device package and a method of manufacturing the light emitting device package according to an embodiment, there are advantages that light extraction efficiency, electrical characteristics, and reliability can be improved.

According to the light emitting device package and the method of manufacturing the light emitting device package according to the embodiment, there are advantages that can reduce a manufacturing cost and improve a manufacturing yield by improving process efficiency and presenting a new package structure.

The light emitting device package according to the embodiment has an advantage that can prevent a reflector from being discolored by providing a body with high reflectivity, and can improve the reliability of the light emitting device package.

According to the light emitting device package and the method of manufacturing the semiconductor device package according to the embodiment, there are advantages that can prevent a re-melting phenomenon from occurring in a bonding region of the light emitting device package while the light emitting device package is re-bonded to a substrate or the like or heat-treated.

The invention claimed is:

1. A light emitting device package comprising:
   a body comprising a first opening, a second opening, and a cavity;
   a conductive layer disposed in the first and second openings, respectively;
   a light emitting device disposed in the cavity;
   a first resin disposed between the light emitting device and the body; and
   a wavelength conversion layer disposed on the light emitting device,
   wherein an upper surface of the conductive layer is in contact with the light emitting device.

2. The light emitting device package of claim 1, wherein the body comprises a third recess concaved from an upper surface toward a lower surface thereof, and
   wherein a third resin is disposed in the third recess.

3. The light emitting device package of claim 2, wherein the first resin and the third resin comprise different materials.

4. The light emitting device package of claim 2, wherein the first resin comprises a reflective material, and the third resin comprises a transparent adhesive material.

5. The light emitting device package of claim 1, wherein the body comprises:
   a first region in which the light emitting device is disposed,
   a second region that is coplanar with an upper surface of the cavity,
   an inclined side portion disposed between the first region and the second region,
   a first recess disposed in the first region, and
   a second recess disposed between the first region and the side portion, and
   wherein an upper surface of the first region is disposed lower than an upper surface of the light emitting device with reference to a lower surface of the body.

6. The light emitting device package of claim 5, wherein the first recess and the second recess are spaced apart from each other.

7. The light emitting device package of claim 5, wherein the first recess extends in a first direction between the first and second openings, and
   wherein the second recess comprises a side surface parallel to the first direction and a side surface parallel to a second direction that is a direction perpendicular to the first direction.

8. The light emitting device package of claim 5, further comprising a second resin disposed in the second recess.

9. The light emitting device package of claim 8, wherein the second resin is disposed in a closed loop shape along a circumference of each of the first and second openings.

10. The light emitting device package of claim 8, wherein at least one of the first resin and the second resin comprises at least one of a reflective material, scattering particles, and a phosphor.

11. The light emitting device package of claim 10, wherein the phosphor comprises $K_2SiF_6:Mn^{4+}$ (KSF).

12. A light emitting device package comprising:
    a body;
    a light emitting device disposed on the body; and
    a first resin disposed between the body and the light emitting device,
    wherein the body comprises first and second openings spaced apart from each other and passing through the body, and first and second recesses concaved from an upper surface of the body toward a lower surface of the body, wherein the light emitting device comprises a first bonding part disposed on the first opening and a second bonding part disposed on the second opening, wherein the first recess is disposed between the first and second openings, wherein the second recess is disposed along a circumference of the first and second openings, and wherein the first resin is disposed in the first recess.

13. A light emitting device package comprising:

a body comprising a cavity having an inclined surface;

a light emitting device disposed on the body; and a first resin disposed on the inclined surface of the cavity, wherein the body comprises first and second openings passing through the body at an upper surface of the body, wherein the light emitting device comprises a first bonding part disposed on the first opening and a second bonding part disposed on the second opening, wherein the first resin is disposed on an upper surface and a side surface of the light emitting device and an inner surface of the cavity wherein the first resin comprises methyl-based silicone or phenyl-based silicone, wherein a molding part is formed in the cavity and covers the first resin disposed on the upper surface and the side surface of the light emitting device and the inner surface of the cavity, wherein the light emitting device package further comprises a second resin disposed under the light emitting device, wherein the body comprises a recess concaved from an upper surface of the body toward a lower surface of the body, wherein the recess is disposed between the first and second openings, wherein the second resin is disposed in the recess, and wherein the second resin comprises a reflective material.

14. The light emitting device package of claim 13, further comprising:

a third resin disposed between the first resin and the light emitting device, and between the first resin and the inclined surface of the cavity.

15. The light emitting device package of claim 14, wherein the third resin comprises $K_2SiF_6:Mn^{4+}$ (KSF) phosphor.

16. The light emitting device package of claim 14, wherein the third resin comprises a first phosphor, and the first resin is a moisture barrier layer.

17. The light emitting device package of claim 16, further comprising a second phosphor disposed in the cavity and disposed on the first resin.

18. The light emitting device package of claim 17, wherein the first phosphor and the second phosphor are different materials.

19. The light emitting device package of claim 17, wherein the first phosphor comprises $K_2SiF_6:Mn^{4+}$, and the second phosphor comprises at least one of $MgF_2:Mn^{2+}$, $(Zn, Mg) F_2:Mn^{2+}$, and $(K, Mg) F_2:Mn^{2+}$.

* * * * *